(12) United States Patent
Montena

(10) Patent No.: US 8,773,255 B2
(45) Date of Patent: ***Jul. 8, 2014

(54) STATUS SENSING AND REPORTING INTERFACE

(75) Inventor: Noah Montena, Syracuse, NY (US)

(73) Assignee: PPC Broadband, Inc., East Syracuse, NY (US)

(*) Notice: Subject to any disclaimer, the term of this patent is extended or adjusted under 35 U.S.C. 154(b) by 413 days.

This patent is subject to a terminal disclaimer.

(21) Appl. No.: 13/077,044

(22) Filed: Mar. 31, 2011

(65) Prior Publication Data

US 2011/0237125 A1    Sep. 29, 2011

Related U.S. Application Data

(63) Continuation-in-part of application No. 12/630,460, filed on Dec. 3, 2009, now Pat. No. 8,149,127, which is a continuation-in-part of application No. 11/860,094, filed on Sep. 24, 2007, now Pat. No. 7,733,236.

(51) Int. Cl.
*G08B 21/00* (2006.01)
*G01R 31/34* (2006.01)

(52) U.S. Cl.
CPC .................................. *G01R 31/343* (2013.01)
USPC .......................................... 340/535; 439/578

(58) Field of Classification Search
CPC ... G01R 31/343; H02H 3/003; H01R 2103/00
USPC ................ 340/635, 568.1–568.4, 572.7, 596, 340/686.3–686.4; 439/488–490, 578; 343/720, 894; 455/575.7, 97, 129
See application file for complete search history.

(56) References Cited

U.S. PATENT DOCUMENTS

| | | | |
|---|---|---|---|
| 2,640,118 | A | 5/1953 | Werner |
| 3,196,424 | A | 7/1965 | Hardesty et al. |
| 3,388,590 | A | 6/1968 | Bond |
| 3,396,339 | A | 8/1968 | Miram |
| 3,524,133 | A | 8/1970 | Arndt |

(Continued)

FOREIGN PATENT DOCUMENTS

| | | |
|---|---|---|
| CN | 101919120 | 12/2010 |
| CN | 102097713 | 6/2011 |

(Continued)

OTHER PUBLICATIONS

Notice of Allowance (Mail Date: Dec. 1, 2011) for U.S. Appl. No. 12/630,460, filed Dec. 3, 2009; Conf. No. 9773.

(Continued)

*Primary Examiner* — John A Tweel, Jr.
(74) *Attorney, Agent, or Firm* — Hiscock & Barclay, LLP

(57) ABSTRACT

A status sensing and reporting interface is provided. The interface includes one of an interface port or an adapter. Each of the interface port and adapter include: a body; a coupling circuit positioned within the body and configured to sense an electrical signal flowing through the status sensing interface; and an electrical parameter sensing circuit positioned within the body and configured to sense a parameter of the electrical signal flowing through the status sensing interface and a physical condition of the connection between the status sensing interface and a connector to which the status sensing interface is operatively coupled.

62 Claims, 12 Drawing Sheets

(56) References Cited

U.S. PATENT DOCUMENTS

| | | |
|---|---|---|
| 3,657,650 A | 4/1972 | Arndt |
| 3,686,623 A | 8/1972 | Nijman |
| 3,768,089 A | 10/1973 | Costanzo |
| 3,808,580 A | 4/1974 | Johnson |
| 3,945,704 A | 3/1976 | Kraus et al. |
| 3,960,428 A | 6/1976 | Naus et al. |
| 3,961,330 A | 6/1976 | Davis |
| 4,034,289 A | 7/1977 | Rozylowicz et al. |
| 4,084,875 A | 4/1978 | Yamamoto |
| 4,240,445 A | 12/1980 | Iskander et al. |
| 4,421,377 A | 12/1983 | Spinner |
| 4,489,419 A | 12/1984 | Wang |
| 4,758,459 A | 7/1988 | Mehta |
| 4,777,381 A | 10/1988 | Fernandes |
| 4,898,759 A | 2/1990 | Hoover et al. |
| 4,911,655 A | 3/1990 | Pinyan et al. |
| 4,915,639 A | 4/1990 | Cohn et al. |
| 4,927,382 A | 5/1990 | Huber |
| 5,059,948 A | 10/1991 | Desmeules |
| 5,076,797 A | 12/1991 | Moulton |
| 5,169,329 A | 12/1992 | Taguchi |
| 5,194,016 A | 3/1993 | Hatagishi et al. |
| 5,217,391 A | 6/1993 | Fisher, Jr. |
| 5,225,816 A | 7/1993 | Lebby et al. |
| 5,278,525 A | 1/1994 | Palinkas |
| 5,278,571 A | 1/1994 | Helfrick |
| 5,345,520 A | 9/1994 | Grile |
| 5,355,883 A | 10/1994 | Ascher |
| 5,462,450 A | 10/1995 | Kodama |
| 5,490,033 A | 2/1996 | Cronin |
| 5,491,315 A | 2/1996 | McMills et al. |
| 5,518,420 A | 5/1996 | Pitschi |
| 5,561,900 A | 10/1996 | Hosler, Sr. |
| 5,565,783 A | 10/1996 | Lau et al. |
| 5,565,784 A | 10/1996 | Derenne |
| 5,620,330 A | 4/1997 | Pizon |
| 5,664,962 A | 9/1997 | Noda |
| 5,892,430 A | 4/1999 | Wiesman et al. |
| 5,904,578 A | 5/1999 | Kubota et al. |
| 5,924,889 A | 7/1999 | Wang |
| 6,034,521 A | 3/2000 | Eckardt |
| 6,041,644 A | 3/2000 | Harde |
| 6,093,043 A | 7/2000 | Gray et al. |
| 6,134,774 A | 10/2000 | Williams et al. |
| 6,193,568 B1 | 2/2001 | Dörr |
| 6,236,551 B1 | 5/2001 | Jones et al. |
| 6,243,654 B1 | 6/2001 | Johnson et al. |
| 6,362,709 B1 | 3/2002 | Paxman et al. |
| 6,414,636 B1 | 7/2002 | Godard et al. |
| 6,490,168 B1 | 12/2002 | Rochowicz et al. |
| 6,549,017 B2 | 4/2003 | Coffeen |
| 6,570,373 B1 | 5/2003 | Viola |
| 6,618,515 B2 | 9/2003 | Kimura et al. |
| 6,646,447 B2 | 11/2003 | Cern et al. |
| 6,650,885 B2 | 11/2003 | Anderson et al. |
| 6,755,681 B2 | 6/2004 | Chun-Chen |
| 6,783,389 B1 | 8/2004 | Lee |
| 6,859,029 B2 | 2/2005 | Yamanaka et al. |
| 6,896,541 B2 | 5/2005 | Benson |
| 6,986,665 B2 | 1/2006 | Schauz et al. |
| 7,029,327 B2 | 4/2006 | Devine |
| 7,084,769 B2 | 8/2006 | Bauer et al. |
| 7,094,104 B1 | 8/2006 | Burke et al. |
| 7,105,982 B1 | 9/2006 | Hagood, IV et al. |
| 7,173,343 B2 | 2/2007 | Kugel |
| 7,212,125 B2 | 5/2007 | Shanks et al. |
| 7,253,602 B2 | 8/2007 | Shvach et al. |
| 7,254,511 B2 | 8/2007 | Niedzwiecki et al. |
| 7,262,626 B2 | 8/2007 | Iwasaki |
| 7,264,493 B2 | 9/2007 | Cooper et al. |
| 7,266,269 B2 | 9/2007 | Koste et al. |
| 7,268,517 B2 | 9/2007 | Rahmel et al. |
| 7,276,267 B2 | 10/2007 | Schauz |
| 7,276,703 B2 | 10/2007 | Berkcan et al. |
| 7,368,827 B2 | 5/2008 | Kulkarni et al. |
| 7,413,353 B2 | 8/2008 | Beer et al. |
| 7,440,253 B2 | 10/2008 | Kauffman |
| 7,472,587 B1 | 1/2009 | Loehndorf et al. |
| 7,479,886 B2 | 1/2009 | Burr |
| 7,482,945 B2 | 1/2009 | Hall |
| 7,507,117 B2 | 3/2009 | Amidon |
| 7,513,795 B2 | 4/2009 | Shaw |
| 7,544,086 B1 | 6/2009 | Wells |
| 7,642,611 B2 | 1/2010 | Tsuji et al. |
| 7,733,236 B2 | 6/2010 | Montena et al. |
| 7,749,022 B2 | 7/2010 | Amidon et al. |
| 7,775,115 B2 | 8/2010 | Theuss et al. |
| 7,850,482 B2 | 12/2010 | Montena |
| 7,909,637 B2 | 3/2011 | Montena |
| 7,930,118 B2 | 4/2011 | Vinden et al. |
| 8,092,234 B2 | 1/2012 | Friedhof et al. |
| 8,149,127 B2 | 4/2012 | Montena |
| 8,303,334 B2 | 11/2012 | Bowman |
| 8,400,318 B2 | 3/2013 | Montena |
| 8,400,319 B2 * | 3/2013 | Montena ............... 340/635 |
| 8,414,326 B2 | 4/2013 | Bowman |
| 8,419,464 B2 | 4/2013 | Montena |
| 8,570,178 B2 | 10/2013 | Lawrence et al. |
| 2002/0090958 A1 | 7/2002 | Ovard |
| 2003/0096629 A1 | 5/2003 | Elliott |
| 2003/0148660 A1 | 8/2003 | Devine |
| 2004/0232919 A1 | 11/2004 | Lacey |
| 2006/0019540 A1 | 1/2006 | Werthman et al. |
| 2007/0173367 A1 | 7/2007 | Duncan |
| 2008/0258876 A1 | 10/2008 | Overhultz |
| 2009/0022067 A1 | 1/2009 | Gotwals |
| 2009/0081902 A1 | 3/2009 | Montena |
| 2009/0096466 A1 | 4/2009 | Delforce |
| 2009/0115427 A1 | 5/2009 | Radtke |
| 2009/0284354 A1 | 11/2009 | Pinkham |
| 2010/0081324 A1 | 4/2010 | Montena |
| 2010/0124838 A1 | 5/2010 | Montena |
| 2010/0124839 A1 | 5/2010 | Montena |
| 2010/0178806 A1 | 7/2010 | Montena |
| 2010/0194382 A1 | 8/2010 | Montena |
| 2010/0315942 A1 | 12/2010 | Jackson |
| 2011/0080158 A1 | 4/2011 | Lawrence et al. |
| 2011/0161050 A1 | 6/2011 | Montena et al. |
| 2011/0237125 A1 | 9/2011 | Montena |
| 2012/0146662 A1 | 6/2012 | Ozbas |

FOREIGN PATENT DOCUMENTS

| | | |
|---|---|---|
| CN | 102222847 | 10/2011 |
| CN | 102346212 | 2/2012 |
| EP | 0527599 A1 | 2/1993 |
| EP | 2203957 A2 | 9/2008 |
| EP | 2621027 A1 | 7/2013 |
| WO | WO 2009/042407 A2 | 4/2009 |
| WO | WO 2011/069129 A2 | 6/2011 |
| WO | WO 2011/120027 A2 | 9/2011 |
| WO | WO 2011/120028 A2 | 9/2011 |

OTHER PUBLICATIONS

PCT/US2011/030106; International Search Report and Written Opinion. Date of Mailing: Oct. 27, 2011, 9 pp.

Office Action (Mail Date: May 19, 2011) for U.S. Appl. No. 12/630,460, filed Dec. 3, 2009; Conf. No. 9773.

Advance E-Mail PCT Notification Concerning Transmittal of International Preliminary Report on Patentability and Written Opinion. PCT/US2008/075917. Date of Mailing: Jun. 24, 2010. 9 pages.

Supplementary European Search Report for Application No. EP08834365. Date of Completion of Search: Oct. 29, 2010. 6 pages.

U.S. Appl. No. 12/964,319, filed Dec. 9, 2010; Confirmation No. 4515.

U.S. Appl. No. 12/966,015, filed Dec. 13, 2010; Confirmation No. 7965.

U.S. Appl. No. 12/732,723, filed Mar. 26, 2010; Confirmation No. 3724.

U.S. Appl. No. 12/732,810, filed Mar. 26, 2010; Confirmation No. 3911.

(56) References Cited

OTHER PUBLICATIONS

U.S. Appl. No. 12/966,633, filed Dec. 13, 2010; Confirmation No. 9139.
PCT/US2011/030105. International Search Report and Written Opinion. Date of Mailing: Nov. 23, 2011. 11 pages.
PCT/US2010/058992; International Search Report and Written Opinion. Date of Mailing: Jul. 29, 2011. 9 pp.
*Ex Parte Quayle* Action (Mail Date Jul. 17, 2012) for U.S. Appl. No. 12/732,810, filed Mar. 26, 2010.
*Ex Parte Quayle* Action (Mail Date Jul. 31, 2012) for U.S. Appl. No. 12/732,723, filed Mar. 26, 2010.
ISA/KR, International Search Report and Written Opinion of the ISA for PCT Application No. PCT/US2008/075917 (Pub. No. WO 2009-042407; published Apr. 2, 2009) as completed Apr. 7, 2009 (12 pgs.).
ISA/KR, International Search Report and Written Opinion of the ISA for PCT Application No. PCT/US2010/058992 (Pub. No. WO 2011-069129; published Jun. 9, 2011) as completed Jul. 29, 2011, (total 6 pgs.).
ISA/KR, International Search Report and Written Opinion of the ISA for PCT Application No. PCT/US2011/030105. Date of Mailing: Nov. 23, 2011 (Pub. No. WO 2011-120027; published Apr. 2, 2009) (9 pgs.).
ISA/KR, International Search Report and Written Opinion for PCT Application No. PCT/US2011/030106; Date of Mailing: Oct. 27, 2011. (7 pgs.).
European Patent Office, Supplementary European Search Report for Application No. EP08834365. Date of Completion of Search: Oct. 29, 2010 (2 pgs.).
WIPO/IB, International Preliminary Report on Patentability (IPRP) dated Jun. 15, 2010 with the Written Opinion (dated Apr. 7, 2009) from PCT Application No. PCT/US2008/075917. Date of Mailing: Jun. 24, 2010. (Pub. No. WO 2009-042407; published Apr. 2, 2009) (8 pgs.).
USPTO, *Ex Parte Quayle* Action (Mail Date Jul. 17, 2012) for U.S. Appl. No. 12/732,810, filed Mar. 26, 2010 (7 pgs.).
USPTO, *Ex Parte Quayle* Action (Mail Date Jul. 31, 2012) for U.S. Appl. No. 12/732,723, filed Mar, 26, 2010 (9 pgs.).
USPTO, Notice of Allowance (Mail Date: Dec. 1, 2011) for U.S. Appl. No. 12/630,460, filed Dec. 3, 2009 (13 pgs.).
USPTO, Office Action (Mail Date: May 19, 2011) for U.S. Appl. No. 12/630,460, filed Dec. 3, 2009 (6 pgs.).

* cited by examiner

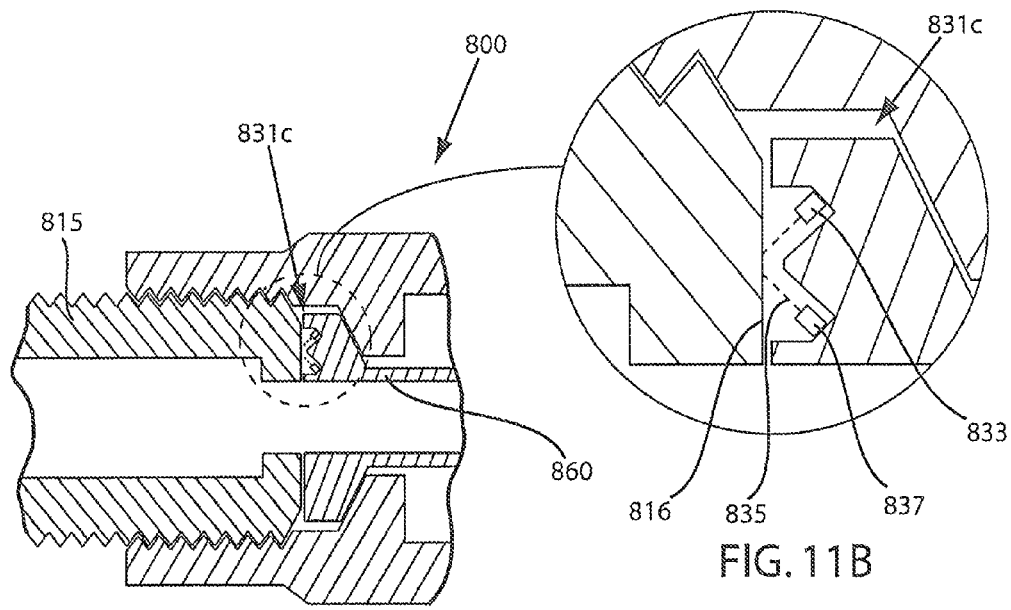
FIG. 11A
FIG. 11B
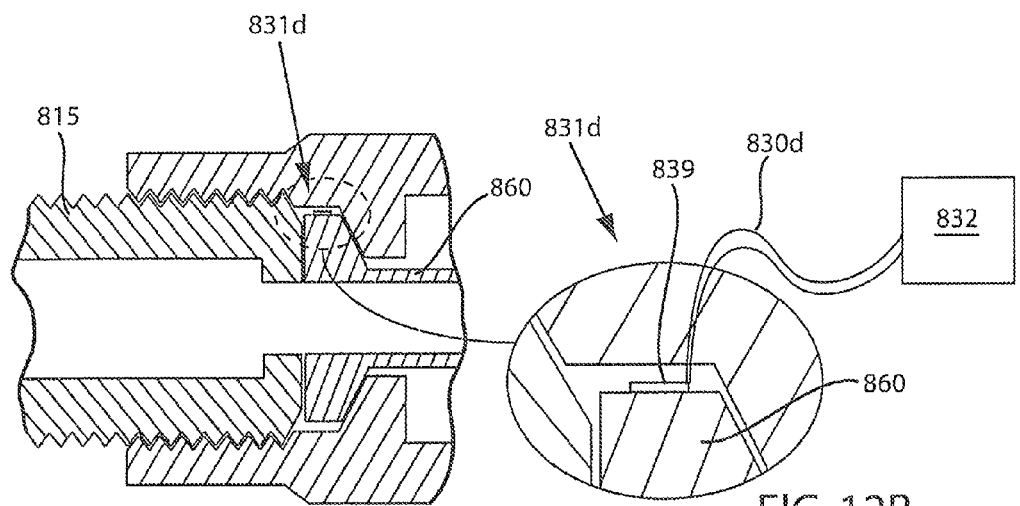
FIG. 12A
FIG. 12B

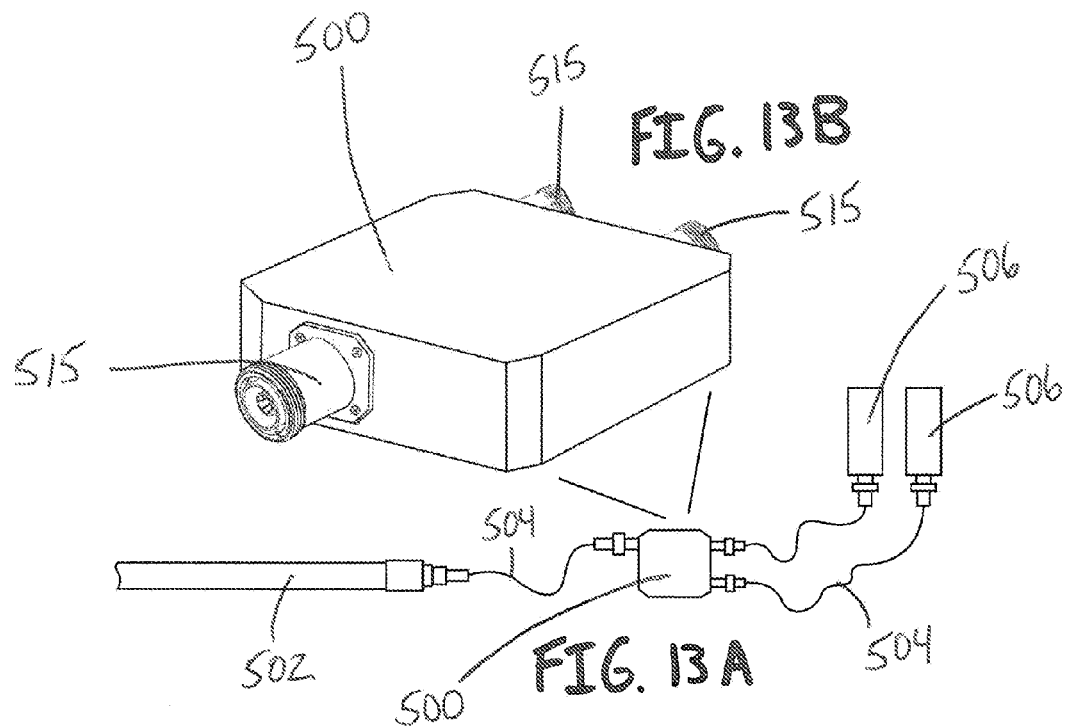
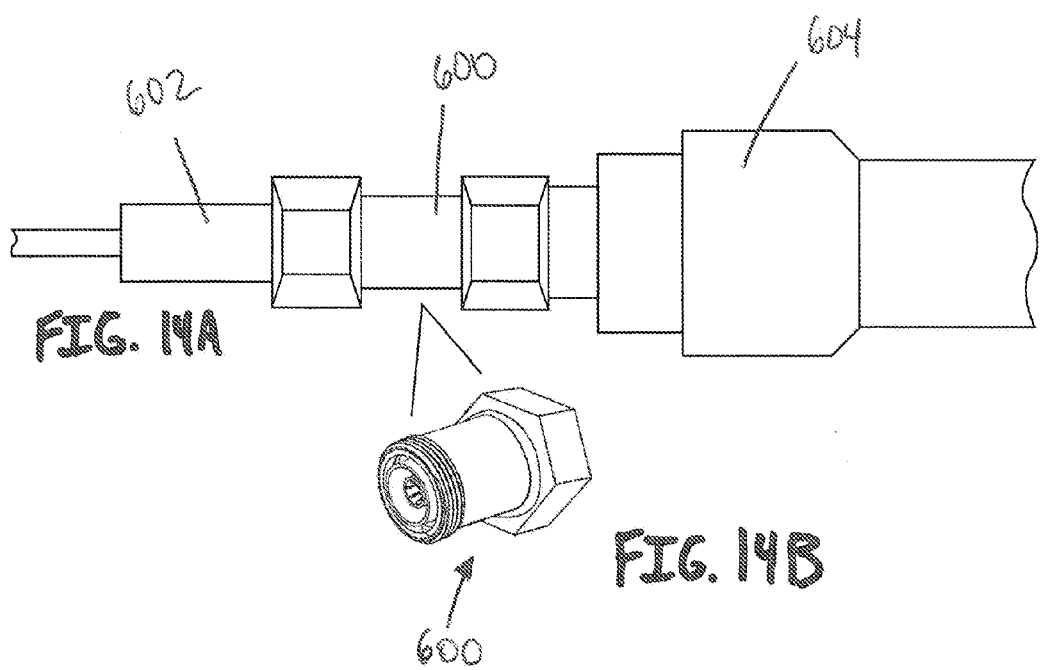

STATUS SENSING AND REPORTING INTERFACE

CROSS-REFERENCE TO RELATED APPLICATIONS

This application is a continuation-in-part of and claims priority from U.S. application Ser. No. 12/630,460 filed Dec. 3, 2009, now issued as U.S. Pat. No. 8,149,127, and entitled COAXIAL CABLE CONNECTOR WITH AN INTERNAL COUPLER AND METHOD OF USE THEREOF, which claims priority from U.S. application Ser. No. 11/860,094 filed Sep. 24, 2007, now issued as U.S. Pat. No. 7,733,236 and entitled COAXIAL CABLE CONNECTOR AND METHOD OF USE THEREOF, the disclosures of which are hereby incorporated entirely herein by reference.

BACKGROUND

1. Technical Field

The present invention relates generally to coaxial cable connectors. More particularly, the present invention relates to a coaxial cable connector and related methodology for ascertaining conditions of a signal flowing through the coaxial cable connector connected to an RF port.

2. Related Art

Cable communications have become an increasingly prevalent form of electromagnetic information exchange and coaxial cables are common conduits for transmission of electromagnetic communications. Many communications devices are designed to be connectable to coaxial cables. Accordingly, there are several coaxial cable connectors commonly provided to facilitate connection of coaxial cables to each other and or to various communications devices.

It is important for a coaxial cable connector to facilitate an accurate, durable, and reliable connection so that cable communications may be exchanged properly. Thus, it is often important to ascertain whether a cable connector is properly connected. However, typical means and methods of ascertaining proper connection status are cumbersome and often involve costly procedures involving detection devices remote to the connector or physical, invasive inspection on-site. Hence, there exists a need for a coaxial cable connector that is configured to maintain proper connection performance, by the connector itself sensing the status of various physical parameters related to the connection of the connector, and by communicating the sensed physical parameter status through an output component of the connector. The instant invention addresses the abovementioned deficiencies and provides numerous other advantages.

BRIEF SUMMARY

The present invention provides an apparatus for use with coaxial cable connections that offers improved reliability.

A first aspect of the present invention provides a coaxial cable connector for connection to an RF port, the connector comprising: a connector body; a physical parameter status sensing circuit, positioned within the connector body, the physical parameter status sensing circuit configured to sense a condition of the connector when connected to the RF port; and a status output component, in electrical communication with the sensing circuit, the status output component positioned within the connector body and configured to maintain the status of the physical parameter.

A second aspect of the present invention provides an RF port coaxial cable connector comprising: a connector body; means for monitoring a physical parameter status located within the connector body; and means for reporting the physical parameter status of the connection of the connector to the RF port, the reporting means configured to provide the physical parameter status to a location outside of the connector body.

A third aspect of the present invention provides a coaxial cable connector connection system having an RF port, the system comprising: a coaxial cable connector, the connector having an internal physical parameter sensing circuit configured to sense a physical parameter of the connection between the connector and an RF port, the connector further having a status output component; a communications device, having the RF port to which the smart connector is coupled to form a connection therewith; and a physical parameter status reader, located externally to the connector, the reader configured to receive, via the status output component, information, from the sensing circuit, about the connection between the connector and the RF port of the communications device.

A fourth aspect of the present invention provides a coaxial cable connector connection status ascertainment method comprising: providing a coaxial cable connector having a connector body; providing a sensing circuit within the connector body, the sensing circuit having a sensor configured to sense a physical parameter of the connector when connected; providing a status output component within the connector body, the status output component in communication with the sensing circuit to receive physical parameter status information; connecting the connector to an RF port to form a connection; and reporting the physical parameter status information, via the status output component, to facilitate conveyance of the physical parameter status of the connection to a location outside of the connector body.

A fifth aspect of the present invention provides a coaxial cable connector for connection to an RF port, the connector comprising: a port connection end and a cable connection end; a mating force sensor, located at the port connection end; a humidity sensor, located within a cavity of the connector, the cavity extending from the cable connection end; and a weather-proof encasement, housing a processor and a transmitter, the encasement operable with a body portion of the connector; wherein the mating force sensor and the humidity sensor are connected via a sensing circuit to the processor and the output transmitter.

A sixth aspect of the present invention provides an RF port coaxial cable connector comprising: a connector body; a control logic unit and an output transmitter, the control logic unit and the output transmitter housed within an encasement located radially within a portion of the connector body; and a sensing circuit, electrically linking a mating force sensor and a humidity sensor to the control logic unit and the output transmitter.

A seventh aspect of the present invention provides a coaxial cable connector for connection to an RF port, the connector comprising: a connector body; a coupling circuit, said coupling circuit positioned within the connector body, said coupling circuit configured to sense an electrical signal flowing through the connector when connected to the RF port; and an electrical parameter sensing circuit electrically connected to said coupling circuit, wherein said electrical parameter sensing circuit is configured to sense a parameter of said electrical signal flowing through the RF port, and wherein said electrical parameter sensing circuit is positioned within the connector body.

An eighth aspect of the present invention provides an RF port coaxial cable connector comprising: a connector body; means for sensing an electrical signal flowing through the connector when connected to the RF port, wherein said means for sensing said electrical signal is located within said connector body; and means for sensing a parameter of said electrical signal flowing through the RF port, wherein said means for sensing said parameter of said electrical signal is located within said connector body.

A ninth aspect of the present invention provides a coaxial cable connector connection system having an RF port, the system comprising: a connector comprising a connector body, a coupling circuit within the connector body, and an electrical parameter sensing circuit electrically connected to said coupling circuit, wherein said coupling circuit is configured to sense an electrical signal flowing through the connector when connected to the RF port, and wherein said electrical parameter sensing circuit is configured to sense a parameter of said electrical signal flowing through the RF port; a communications device comprising the RF port to which the connector is coupled to form a connection; and a parameter reading device located externally to the connector, wherein the parameter reading device is configured to receive a signal comprising a reading associated with said parameter.

A tenth aspect of the present invention provides a coaxial cable connection method comprising: providing a coaxial cable connector comprising a connector body, a coupling circuit, positioned within the connector body, an electrical parameter sensing circuit electrically connected to said coupling circuit, and an output component positioned within the connector body, wherein said electrical parameter sensing circuit is positioned within the connector body, wherein said coupling circuit is configured to sense an electrical signal flowing through the connector when connected to an RF port, wherein said electrical parameter sensing circuit is configured to sense a parameter of said electrical signal flowing through the RF port, and wherein the output component is in communication with said electrical parameter sensing circuit to receive a reading associated with said parameter; connecting the connector to said RF port to form a connection; and reporting the reading associated with said parameter, via the output component, to communicate the reading to a location external to said connector body.

The foregoing and other features of the invention will be apparent from the following more particular description of various embodiments of the invention.

DESCRIPTION OF THE DRAWINGS

Some of the embodiments of this invention will be described in detail, with reference to the following figures, wherein like designations denote like members, wherein:

FIG. 11A depicts a partial side cross-sectional view of an embodiment a connector mated to an RF port, the connector having an optical connection tightness sensor, in accordance with the present invention;

FIG. 11B depicts a blown up view of the optical connection tightness sensor depicted in FIG. 11A, in accordance with the present invention;

FIG. 12A depicts a partial side cross-sectional view of an embodiment a connector mated to an RF port, the connector having a strain gauge connection tightness sensor, in accordance with the present invention;

FIG. 12B depicts a blown up view of the strain gauge connection tightness sensor depicted in FIG. 12A, as connected to further electrical circuitry, in accordance with the present invention.

FIG. 13A depicts a side view of an embodiment of an exemplary communication device having interface ports each having a sensing circuit therein, the interface ports being connected to connectors, in accordance with the present invention;

FIG. 13B depicts a close-up perspective view of an embodiment of the exemplary communication device of FIG. 13A;

FIG. 14A depicts a side view of an embodiment of a coaxial cable adapter having a sensing circuit therein, the adapter being coupled between connectors, in accordance with the present invention; and FIG. 14B depicts a close-up perspective view of an embodiment of the coaxial cable adapter of FIG. 14A.

DETAILED DESCRIPTION OF THE EMBODIMENTS

Figure 1:
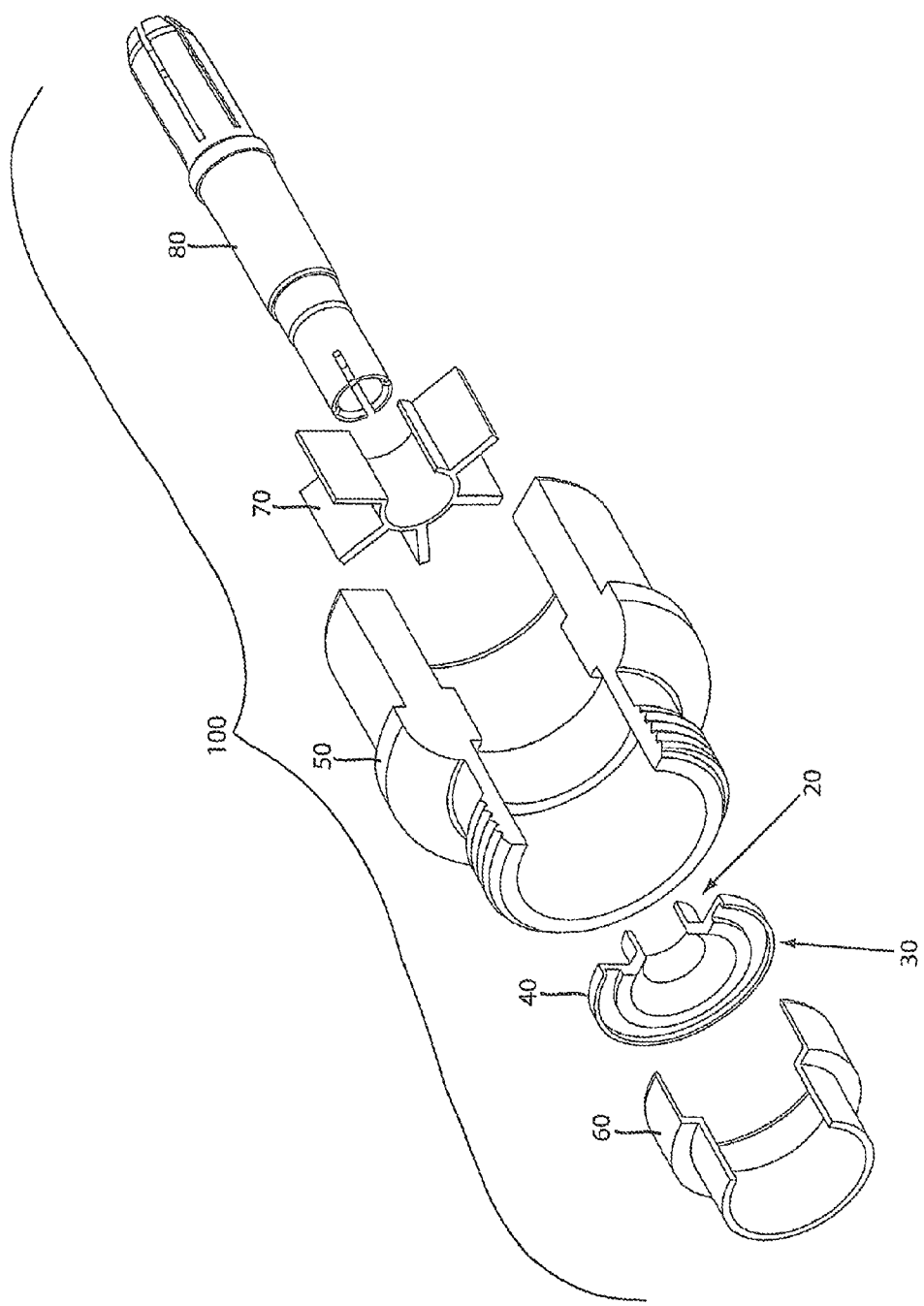
FIG. 1 depicts an exploded cut-away perspective view of an embodiment of a coaxial cable connector with a sensing circuit, in accordance with the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., which are disclosed simply as an example of an embodiment. The features and advantages of the present invention are illustrated in detail in the accompanying drawings, wherein like reference numerals refer to like elements throughout the drawings.

As a preface to the detailed description, it should be noted that, as used in this specification and the appended claims, the singular forms "a", "an" and "the" include plural referents, unless the context clearly dictates otherwise.

It is often desirable to ascertain conditions relative to a coaxial cable connector connection or relative to a signal flowing through a coaxial connector. A condition of a connector connection at a given time, or over a given time period, may comprise a physical parameter status relative to a connected coaxial cable connector. A physical parameter status is an ascertainable physical state relative to the connection of the coaxial cable connector, wherein the physical parameter status may be used to help identify whether a connector connection performs accurately. A condition of a signal flowing through a connector at a given time, or over a given time period, may comprise an electrical parameter of a signal flowing through a coaxial cable connector. An electrical parameter may comprise, among other things, an electrical signal (RF) power level, wherein the electrical signal power level may be used for discovering, troubleshooting and eliminating interference issues in a transmission line (e.g., a transmission line used in a cellular telephone system). Embodiments of a connector 100 of the present invention may be considered "smart", in that the connector 100 itself ascertains physical parameter status pertaining to the connection of the connector 100 to an RF port. Additionally, embodiments of a connector 100 of the present invention may be considered "smart", in that the connector 100 itself detects and measures a parameter of an electrical signal (e.g., an RF power level) flowing through a coaxial connector.

Figure 2:
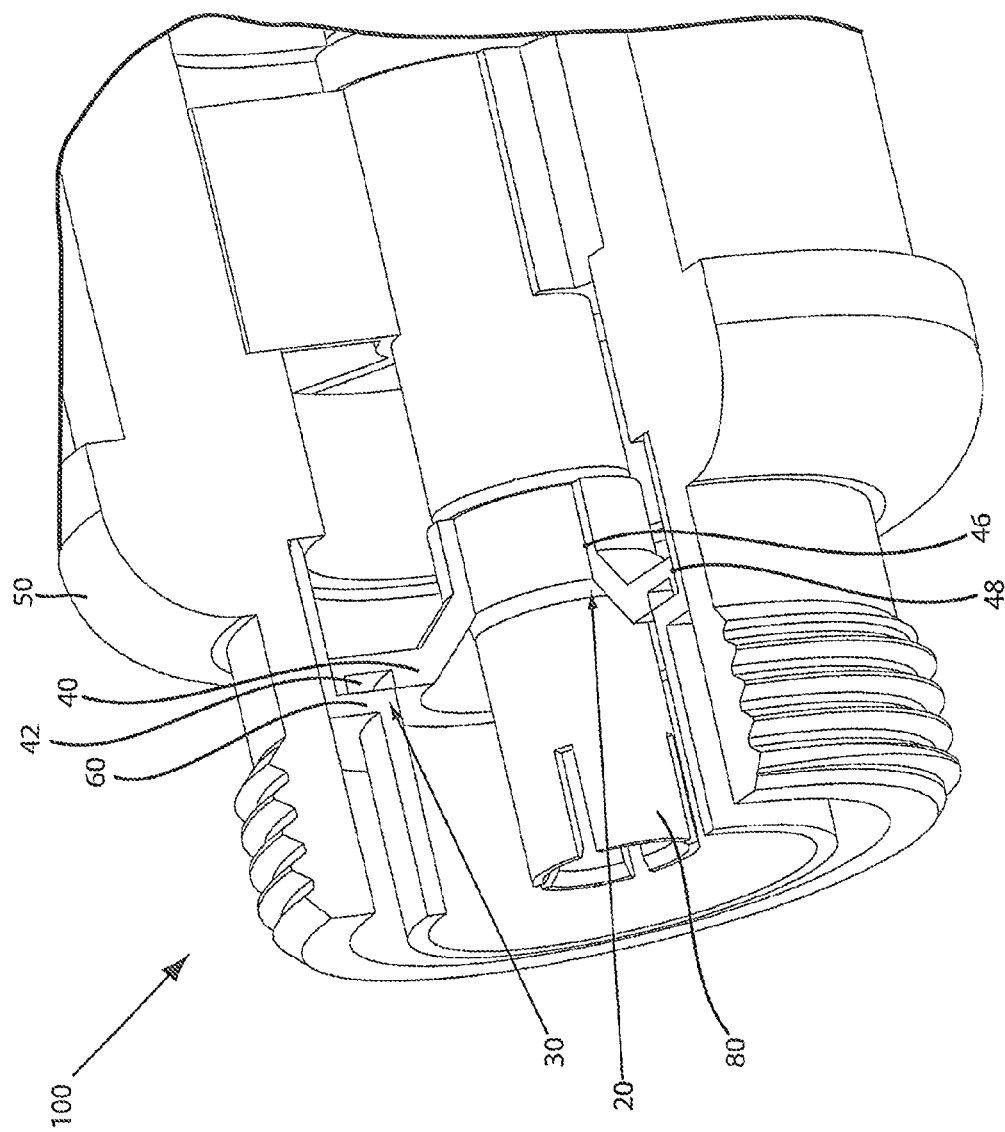
FIG. 2 depicts a close-up cut-away partial perspective view of an embodiment of a coaxial cable connector with a sensing circuit, in accordance with the present invention.
Figure 3:
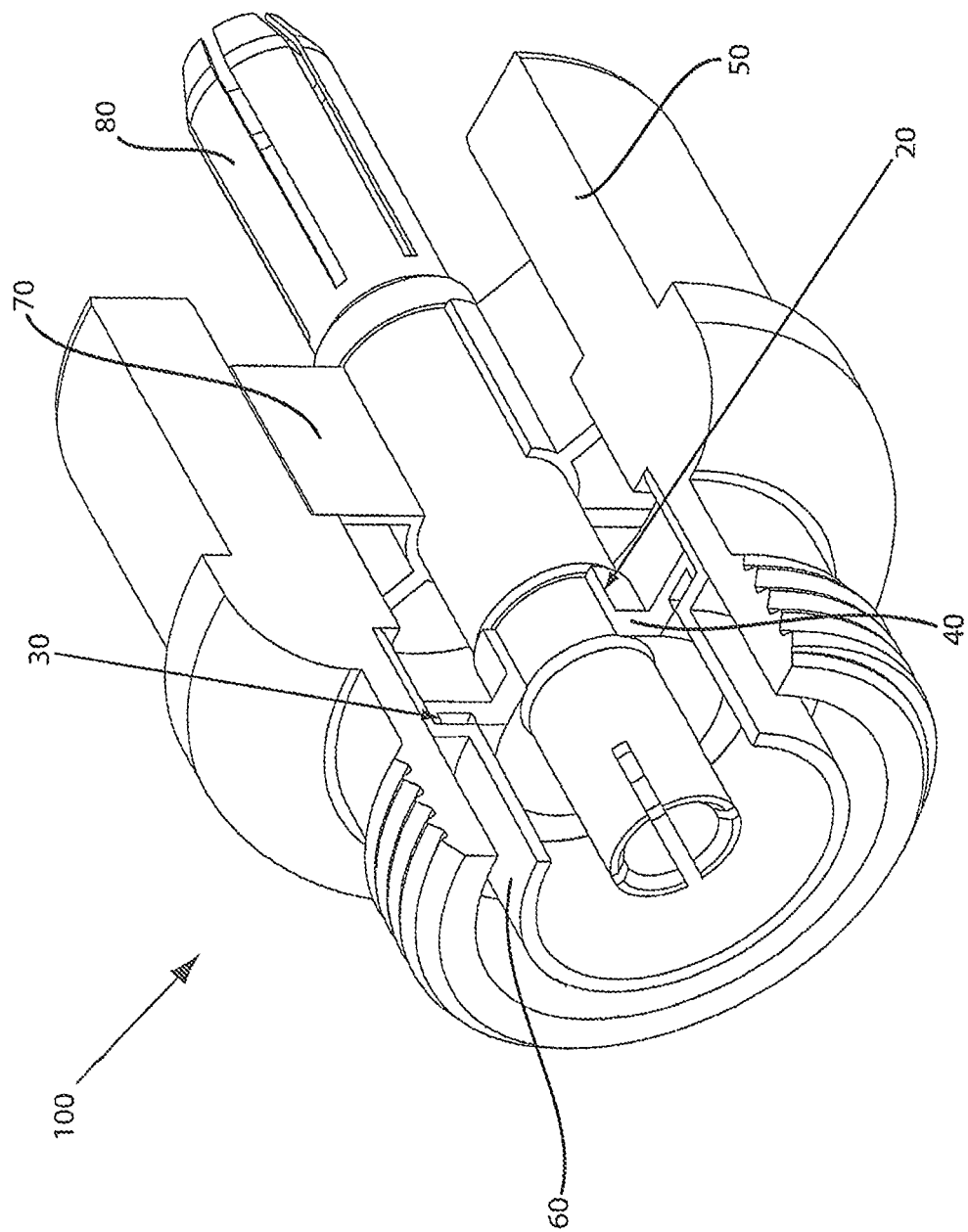
FIG. 3 depicts a cut-away perspective view of an embodiment of an assembled coaxial cable connector with an integrated sensing circuit, in accordance with the present invention.

Referring to the drawings, FIGS. 1-3 depict cut-away perspective views of an embodiment of a coaxial cable connector 100 with an internal sensing circuit 30, in accordance with the present invention. The connector 100 includes a connector body 50. The connector body 50 comprises a physical structure that houses at least a portion of any internal components of a coaxial cable connector 100. Accordingly the connector body 50 can accommodate internal positioning of various components, such as a first spacer 40, an interface sleeve 60, a second spacer 70, and/or a center conductor contact 80 that may be assembled within the connector 100. In addition, the connector body 50 may be conductive. The structure of the various component elements included in a connector 100 and the overall structure of the connector 100 may operably vary. However, a governing principle behind the elemental design of all features of a coaxial connector 100 is that the connector 100 should be compatible with common coaxial cable interfaces pertaining to typical coaxial cable communications devices. Accordingly, the structure related to the embodiments of coaxial cable connectors 100 depicted in the various FIGS. 1-6 is intended to be exemplary. Those in the art should appreciate that a connector 100 may include any operable structural design allowing the connector 100 to sense a condition of a connection of the connector 100 with an interface to an RF port of a common coaxial cable communications device, and also report a corresponding connection performance status to a location outside of the connector 100. Additionally, connector 100 may include any operable structural design allowing the connector 100 to sense, detect, and measure a parameter of an electrical signal flowing through connector 100.

A coaxial cable connector 100 has internal circuitry that may sense connection conditions, store data, and/or determine monitorable variables of physical parameter status such as presence of moisture (humidity detection, as by mechanical, electrical, or chemical means), connection tightness (applied mating force existent between mated components), temperature, pressure, amperage, voltage, signal level, signal frequency, impedance, return path activity, connection location (as to where along a particular signal path a connector 100 is connected), service type, installation date, previous service call date, serial number, etc. A connector 100 includes a physical parameter status sensing/an electrical parameter sensing circuit 30. A sensing circuit 30 may be integrated onto typical coaxial cable connector components. The sensing circuit 30 may be located on existing connector structures. For example, a connector 100 may include a component such as a first spacer 40 having a face 42. A sensing circuit 30 may be positioned on the face 42 of the first spacer 40 of the connector 100. The physical parameter status sensing circuit 30 is configured to sense a condition of the connector 100 when the connector 100 is connected with an interface of a common coaxial cable communications device, such as interface port 15 of receiving box 8 (see FIG. 5). Moreover, various portions of the circuitry of a sensing circuit 30 may be fixed onto multiple component elements of a connector 100.

Power for the physical parameter status sensing circuit 30 and/or other powered components of a connector 100 may be provided through electrical communication with the center conductor 80. For instance, traces may be printed on the first spacer 40 and positioned so that the traces make electrical contact with the center conductor contact 80 at a location 46 (see FIG. 2). Contact with the center conductor contact 80 at location 46 facilitates the ability for the sensing circuit 30 to draw power from the cable signal(s) passing through the center conductor contact 80. Traces may also be formed and positioned so as to make contact with grounding components. For example, a ground path may extend through a location 48 between the first spacer 40 and the interface sleeve 60, or any other operably conductive component of the connector 100. A connector 100 may be powered by other means. For example, the connector 100 may include a battery, a micro fuel cell, a solar cell or other like photovoltaic cell, a radio frequency transducer for power conversion from electromagnet transmissions by external devices, and/or any other like powering means. Power may come from a DC source, an AC source, or an RF source. Those in the art should appreciate that a physical parameter status sensing circuit 30 should be powered in a way that does not significantly disrupt or interfere with electromagnetic communications that may be exchanged through the connector 100.

Figure 4A:
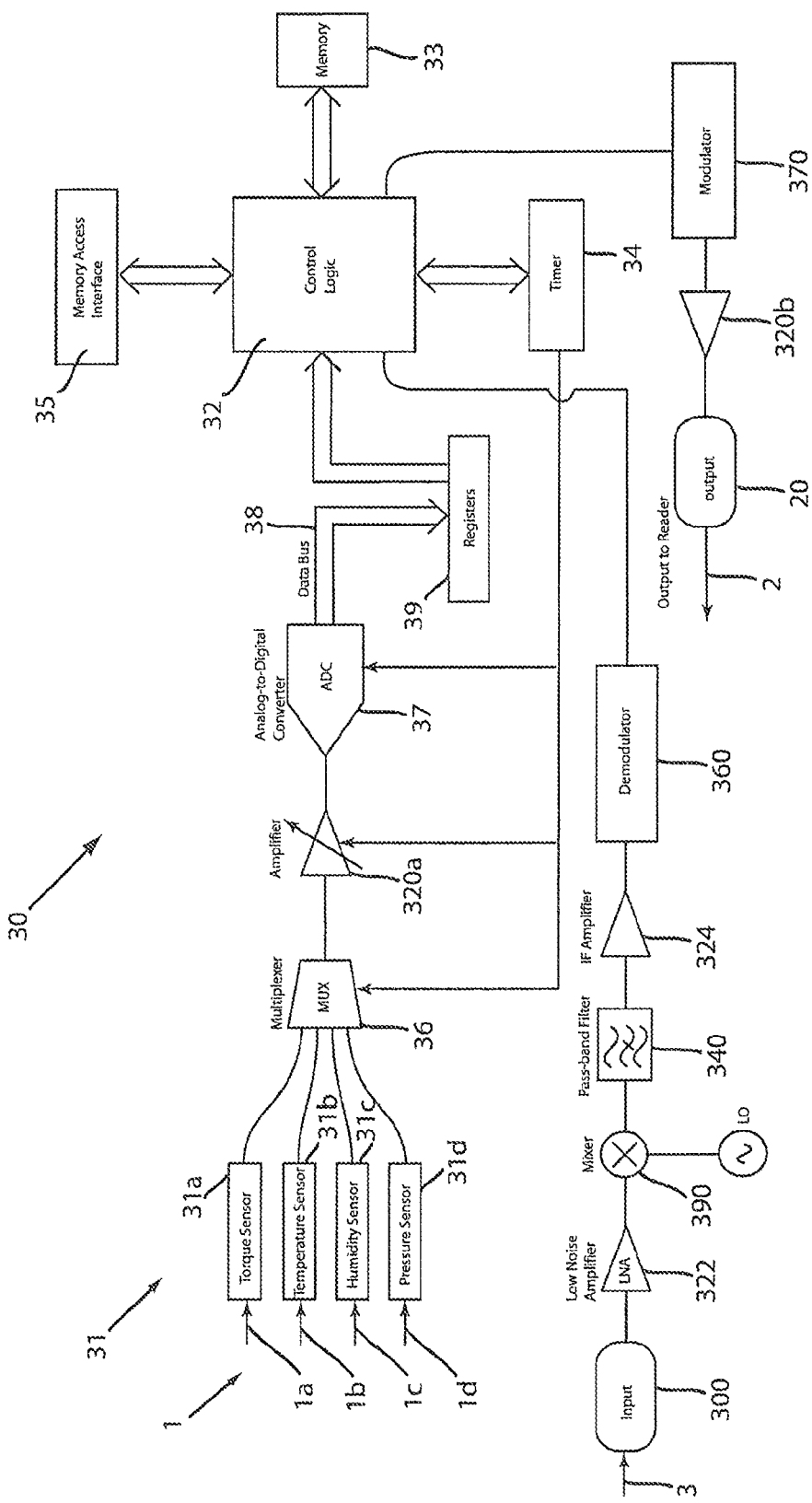
FIG. 4A depicts a schematic view of an embodiment of a sensing circuit, in accordance with the present invention.

With continued reference to the drawings, FIG. 4A depicts a schematic view of an embodiment of a physical parameter status sensing circuit 30. Embodiments of a physical parameter status sensing circuit 30 may be variably configured to include various electrical components and related circuitry so that a connector 100 can measure or determine connection performance by sensing a condition 1 relative to the connection of the connector 100, wherein knowledge of the sensed condition 1 may be provided as physical parameter status information and used to help identify whether the connection performs accurately. Accordingly, the circuit configuration as schematically depicted in FIG. 4A is provided to exemplify one embodiment of a sensing circuit 30 that may operate with a connector 100. Those in the art should recognize that other circuit 30 configurations may be provided to accomplish the sensing of physical parameters corresponding to a connector 100 connection. For instance, each block or portion of the sensing circuit 30 can be individually implemented as an analog or digital circuit.

As schematically depicted, a sensing circuit 30 may comprise one or more sensors 31. For example, the sensing circuit 30 may include a torque sensor 31a configured to detect the tightness of the connection of the connector 100 with an interface of another coaxial communications device having an RF port. The torque sensor 31a may measure, determine, detect, or otherwise sense a connection condition 1a, such as the mating force resultant from the physical connection of the connector 100 with the interface, such as RF port 15 of the receiving box 8 (see FIG. 5). A connector 100 may include a plurality of sensors 31. For instance, in addition to a torque sensor 31a, a connector 100 may include: a temperature sensor 31b configured to sense a connection condition 1b, such as the temperature of all or a portion of the connector 100; a humidity sensor 31c configured to sense a connection condition 1c, such as the presence and amount of any moisture or water vapor existent in the connector 100 and/or in the connection between the connector 100 and an interface with another cable communications device; and a pressure sensor 31d configured to sense a connection 1d, such as the pressure existent in all or a portion of the connector 100 and/or in the overall connection involving the connector 100 and an interface with another cable communications device. Other sensors may also be included in a sensing circuit 30 to help detect connection conditions 1 related to physical parameters such as amperage, voltage, signal level, signal frequency, impedance, return path activity, connection location (as to where along a particular signal path a connector 100 is connected), service type, installation date, previous service call date, serial number, etc.

A sensed connection condition 1 may be electrically communicated within a sensing circuit 30 from a sensor 31. For example the sensed condition may be communicated as physical parameter status information to a control logic unit 32. The control logic unit 32 may include and/or operate with a protocol to govern what, if any, actions can/should be taken with regard to the sensed condition 1 following its electrical communication to the control logic unit 32. The control logic unit 32 may be a microprocessor or any other electrical component or electrical circuitry capable of processing a signal based on governing logic. A memory unit 33 may be in electrical communication with the control logic unit 32. The memory unit 33 may store physical parameter status information related to sensed connection conditions 1. The stored physical parameter status information may then be later communicated or processed by the control logic unit 32 or otherwise operated on by the sensing circuit 30. Furthermore the memory unit 33 may be a component or device that may store governing protocol. The governing protocol may be instructions that form a computer program, or may be simple logic commands. Stored protocol information that governs control logic operations may comprise a form of stored program architecture versatile for processing over some interval of time. A sensing circuit 30 may accordingly include a timer 34. In addition, a sensing circuit 30 may include a memory access interface 35. The memory access interface 35 may be in electrical communication with the control logic unit 32.

Various other electrical components may be included in embodiments of a sensing circuit 30. For example, where the circuit 30 includes multiple sensors 31, a multiplexer 36 may be included to integrate signals from the various sensors 31. Moreover, depending on signal strength coming from a sensor 31, a sensing circuit 30 may include an amplifier 320a to adjust the strength of the signal from the sensor 31 sufficient to be operated on by other electrical components, such as the control logic unit 32. Additionally, an ADC unit 37 (analog-to-digital converter) may be included in a sensing circuit 30. The ADC unit 37 may, if needed, convert analog signals originating from the sensors 31 to digital signals. The multiplexer 36, ADC unit 37 and amplifier 320a, may all be in parallel with the control logic unit 32 and the timer 34 helping to coordinate operation of the various components. A data bus 38 may facilitate transfer of signal information between a sensor 31 and the control logic unit 32. The data bus 38 may also be in communication with one or more registers 39. The registers 39 may be integral to the control logic unit 32, such as microcircuitry on a microprocessor. The registers 39 generally contain and/or operate on signal information that the control logic unit 32 may use to carry out sensing circuit 30 functions, possibly according to some governing protocol. For example, the registers 39 may be switching transistors integrated on a microprocessor, and functioning as electronic "flip-flops".

A sensing circuit 30 may include and/or operate with an input component 300. The input component 300 may receive input signals 3, wherein the input signals 3 may originate from a location outside of the connector 100. For example, the input component 300 may comprise a conductive element that is physically accessible by a communications device, such as a wire lead 410 from a reader 400a (see FIG. 5). The sensing circuit 30 may be electrically linked by traces, leads, wires, or other electrical conduits located within a connector 100a to electrically connect an external communications device, such as the reader 400a. An input signal 3 may originate from a reader 400a located outside of the connector, wherein the reader 400a transmits the input signal 3 through a wire lead 410a-b in electrical contact with the connector 100a so that the input signal 3 passes through the input component 300 and to the electrically connected sensing circuit 30. In addition, a sensing circuit 30 may include and/or operate with an input component 300, wherein the input component 300 is in electrical contact with the center conductor of a connected coaxial cable 10. For instance, the input component 300 may be a conductive element, such as a lead, trace, wire or other electrical conduit, that electrically connects the sensing circuit 30 to the center conductor contact 80 at or near a location 46 (see FIG. 2). Accordingly, an input signal 5 may originate from some place outside of the connector 100, such as a point along the cable line, and be passed through the cable 10 until the input signal 5 is inputted through the input component 300 into the connector 100 and electrically communicated to the sensing circuit 30. Thus a sensing circuit 30 of a connector 100 may receive input signals from a point somewhere along the cable line, such as the head end. Still further, an input component 300 may include wireless capability. For example the input component 300 may comprise a wireless receiver capable of receiving electromagnet transmissions, such as, radio-waves, Wi-fi transmissions, RFID transmissions, Bluetooth™ wireless transmissions, and the like. Accordingly, an input signal, such as wireless input signal 4 depicted in FIG. 5, may originate from some place outside of the connector 100, such as a wireless reader 400b located a few feet from the connector 100, and be received by the input component 300 in the connector 100 and then electrically communicated to the sensing circuit 30.

A sensing circuit 30 may include various electrical components operable to facilitate communication of an input signal 3, 4, 5 received by an input component 300. For example, a sensing circuit 30 may include a low noise amplifier 322 in electrical communication with a mixer 390. In addition, a sensing circuit 30 may include a pass-band filter 340 configured to filter various signal band-widths related to incoming input signals 3, 4, 5. Furthermore, a sensing circuit may include an IF amplifier 324 configured to amplify intermediate frequencies pertaining to received input signals 3-5 communicated through the input component 300 to the sensing circuit 30. If needed, a sensing circuit 30 may also include a demodulator 360 in electrical communication with the control logic unit 32. The demodulator 360 may be configured to recover the information content from the carrier wave of a received input signal 3, 4, 5.

Monitoring a physical parameter status of a connection of the connector 100 may be facilitated by an internal sensing circuit 30 configured to report a determined condition of the connector 100 connection. The sensing circuit 30 may include a signal modulator 370 in electrical communication with the control logic unit 32. The modulator 370 may be configured to vary the periodic waveform of an output signal 2, provided by the sensing circuit 30. The strength of the output signal 2 may be modified by an amplifier 320b. Ultimately the output signal 2 from the sensing circuit 30 is transmitted to an output component 20 in electrical communication with the sensing circuit 30. Those in the art should appreciate that the output component 20 may be a part of the sensing circuit 30. For example the output component 20 may be a final lead, trace, wire, or other electrical conduit leading from the sensing circuit 30 to a signal exit location of a connector 100.

Embodiments of a connector 100 include a physical parameter status output component 20 in electrical communication with the sensing circuit 30. The status output component 20 is positioned within the connector body 50 and configured to facilitate reporting of information relative to one or more sensed conditions comprising a physical parameter status to a location outside of the connector body 50. An output component 20 may facilitate the dispatch of information pertaining to a physical parameter status associated with condition(s) 1 sensed by a sensor 31 of a sensing circuit 30 and reportable as information relative to the performance of the connection of a connector 100. For example, the sensing circuit 30 may be in electrical communication with the center conductor contact 80 through a status output component 20, such as a lead or trace, in electrical communication with the sensor circuit 30 and positioned to electrically connect with the center conductor contact 80 at a location 46 (see FIG. 2). Sensed physical parameter status information may accordingly be passed as an output signal 2 from the sensing circuit 30 of the first spacer 40 through the output component 20, such as traces electrically linked to the center conductor contact 80. The outputted signal(s) 2 can then travel outside of the connector 100 along the cable line (see FIG. 5) corresponding to the cable connection applicable to the connector 100. Hence, the reported physical parameter status may be transmitted via output signal(s) 2 through the output component 20 and may be accessed at a location along the cable line outside of the connector 100. Moreover, the status output component 20 may comprise a conductive element that is physically accessible by a communications device, such as a wire lead 410 from a reader 400a (see FIG. 5).

The sensing circuit 30 may be electrically linked by traces, leads, wires, or other electrical conduits located within a connector, such as connector 100a, to electrically communicate with an external communications device, such as the reader 400a. An output signal 2 from the sensing circuit 30 may dispatch through the status output component 20 to a reader 400a located outside of the connector, wherein the reader 400a receives the output signal 2 through a wire lead 410 in electrical contact with the connector 100a. In addition, a status output component 20 may include wireless capability. For example the output component 20 may comprise a wireless transmitter capable of transmitting electromagnet signals, such as, radio-waves, Wi-fi transmissions, RFID transmissions, satellite transmissions, Bluetooth™ wireless transmissions, and the like. Accordingly, an output signal, such as wireless output signal 2b depicted in FIG. 5, may be reported from the sensing circuit 30 and dispatched through the status output component 20 to a device outside of the connector 100, such as a wireless reader 400b located a few feet from the connector 100. A status output component 20 is configured to facilitate conveyance of the physical parameter status to a location outside of the connector body 50 so that a user can obtain the reported information and ascertain the performance of the connector 100. The physical parameter status may be reported via an output signal 2 conveyed through a physical electrical conduit, such as the center conductor of the cable 10, or a wire lead 410 from a reader 400a (see FIG. 5).

Figure 4B:
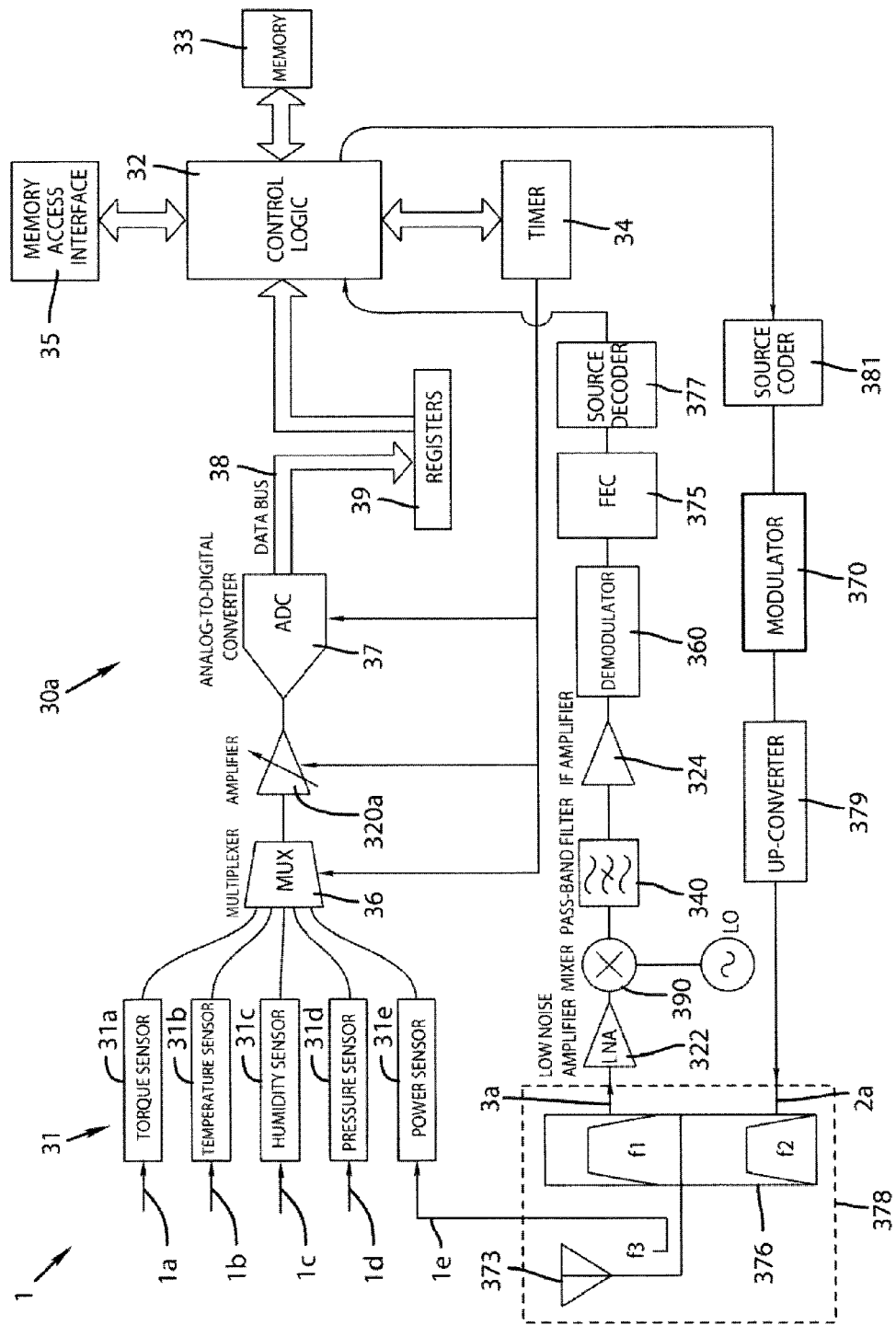
FIG. 4B depicts a schematic view of an embodiment of a signal sensing circuit, in accordance with the present invention.

With continued reference to the drawings, FIG. 4B (i.e., a modified embodiment with respect to FIG. 4A) depicts a schematic view of an embodiment of a (electrical) signal parameter sensing circuit 30a. In addition to or in contrast with sensing circuit 30 of FIG. 4A, embodiments of a signal parameter sensing circuit 30a of FIG. 4B may be variably configured to include various electrical components and related circuitry so that a connector 100 can measure or determine an electrical signal parameter (e.g., an RF signal power level) of an electrical signal flowing through connector 100 in order to determine for example, interference in a transmission line. Accordingly, the circuit configuration as schematically depicted in FIG. 4B is provided to exemplify one embodiment of a sensing circuit 30a that may operate with a connector 100. Those in the art should recognize that other circuit 30a configurations may be provided to accomplish the sensing of electrical signal parameters of an electrical signal flowing through connector 100. For instance, each block or portion of the sensing circuit 30a can be individually implemented as an analog or digital circuit.

As schematically depicted, sensing circuit 30a may comprise a power sensor 31e and a coupling circuit 378. Coupling circuit 378 may comprise a coupler (i.e., a coupling device) 373. Coupler 373 may comprise, among other things, a directional coupler such as, for example, an antenna. Coupler 373 may be coupled to center conductor 80 of connector 100. Additionally, coupler 373 may be coupled to center conductor 80 of connector 100 directly or indirectly. Coupler 373 may comprise a single coupler or a plurality of couplers. Additional couplers and/or sensors may also be included in sensing circuit 30a to help detect signal conditions or levels of a signal such as amperage, voltage, signal level, signal frequency, impedance, return path activity, connection location (as to where along a particular signal path a connector 100 is connected), service type, installation date, previous service call date, serial number, etc.

A sensed electrical signal 1e may be electrically communicated within sensing circuit 30a from coupler 373 to sensor 31e. Sensor 31a retrieves the electrical signal from coupler 373 and measures a parameter of the electrical signal (e.g., an RF power level of the electrical signal). The parameter may be transmitted within circuit 30a. For example the parameter may be communicated as electrical signal parameter information to a control logic unit 32. The control logic unit 32 may include and/or operate with protocol to govern what, if any, actions can/should be taken with regard to the sensed condition 1e following its electrical communication to the control logic unit 32. Memory unit 33 may be in electrical communication with the control logic unit 32 and may store electrical signal parameter information related to sensed electrical signal 1e. The stored electrical signal parameter information may then be later communicated or processed by the control logic unit 32 or otherwise operated on by the sensing circuit 30a.

In addition to the components described with reference to FIG. 4A and illustrated in FIG. 4B, various other electrical components may be included in embodiments of sensing circuit 30a. For example, sensing circuit 30a may include and/or operate with a diplexer 376 (i.e., comprised by coupling circuit 378) connected to coupler 373. A diplexer is a passive device that implements frequency domain multiplexing. Diplexer 376 comprises two ports (F1 and F2) multiplexed onto a third port (F3). Coupler 373 may receive input signals 3a and pass the input signals 3a through port F1, wherein the input signals 3a may originate from a location outside of the connector 100. For example, the coupler 373 may be physically accessible by a communications device, such as a wire lead 410 from a reader 400a (see FIG. 5). The sensing circuit 30a may be additionally electrically linked by traces, leads, wires, or other electrical conduits located within a connector 100a to electrically connect an external communications device, such as the reader 400a. An input signal 3a may originate from a reader 400a located outside of the connector, wherein the reader 400a transmits the input signal 3a through a wire lead 410a-b in electrical contact with the connector 100a so that the input signal 3a passes through the input component 300 and to the electrically connected sensing circuit 30. Accordingly, input signal 3a may originate from some place outside of the connector 100, such as a point along the cable line, and be passed through the cable 10 until the input signal 3a is inputted through coupler 373 into the connector 100 and electrically communicated to the sensing circuit 30a. Thus a sensing circuit 30a of a connector 100 may receive input signals from a point somewhere along the cable line, such as the head end. Coupler 373 includes wireless capability. For example coupler 373 comprises a wireless receiver capable of receiving electromagnet transmissions, such as, radio-waves, Wi-fi transmissions, RFID transmissions, Bluetooth™ wireless transmissions, and the like. Accordingly, an input signal, such as wireless input signal 4 depicted in FIG. 5, may originate from some place outside of the connector 100, such as a wireless reader 400b located a few feet from the connector 100, and be received coupler 373 in the connector 100 and then electrically communicated to the sensing circuit 30a. Alternatively, coupling circuit 378 may comprise a time division multiplexer/demultiplexer circuit (i.e., replacing diplexer 376) connected to coupler 373.

Sensing circuit 30a may include various electrical components operable to facilitate communication of an input signal 3a received by coupler 373. For example, sensing circuit 30a may include a forward error correction (FEC) circuit 375 connected to a source decoder 377. FEC circuit 375 and source decoder 377 are connected between demodulator 360 and control logic 32. FEC circuit 375 is used to correct errors in input data from input signal 3a.

Coupler 373 may transmit output signals 2a received from port F2. Output signal comprises information relative to an electrical signal parameter (e.g., an RF signal power level) of an electrical signal flowing through connector 100. Coupler 373 may facilitate the dispatch of information pertaining to an electrical signal parameter (e.g., an RF signal power level) of an electrical signal flowing through connector 100 and sensed by a coupler 373 and power sensor 31e of a sensing circuit 30a and reportable as information relative to signal level troubleshooting such as discovering interference in a transmission system. For example, the sensing circuit 30a may be in electrical communication with the center conductor contact 80 through coupler 373. Sensed electrical signal parameter information may accordingly be passed as an output signal 2a from the sensing circuit 30a of the first spacer 40 through coupler 373. The outputted signal(s) 2a can then travel outside of the connector 100. Hence, the reported parameter of an electrical signal may be transmitted via output signal(s) 2a through coupler 373 and may be accessed at a location outside of the connector 100. Coupler 373 may comprise a wireless transmitter capable of transmitting electromagnet signals, such as, radio-waves, Wi-fi transmissions, RFID transmissions, satellite transmissions, Bluetooth™ wireless transmissions, and the like. Accordingly, an output signal, such as wireless output signal 2b depicted in FIG. 5, may be reported from the sensing circuit 30a and dispatched through coupler 373 to a device outside of the connector 100, such as a wireless reader 400b located a few feet from the connector 100. Coupler 373 is configured to facilitate conveyance of the electrical signal parameter to a location outside of the connector body 50 so that a user can obtain the reported information. Sensing circuit 30a additionally comprises a source coder 381 and an up-convertor 379 for conditioning the output signal 2a.

Figure 5:
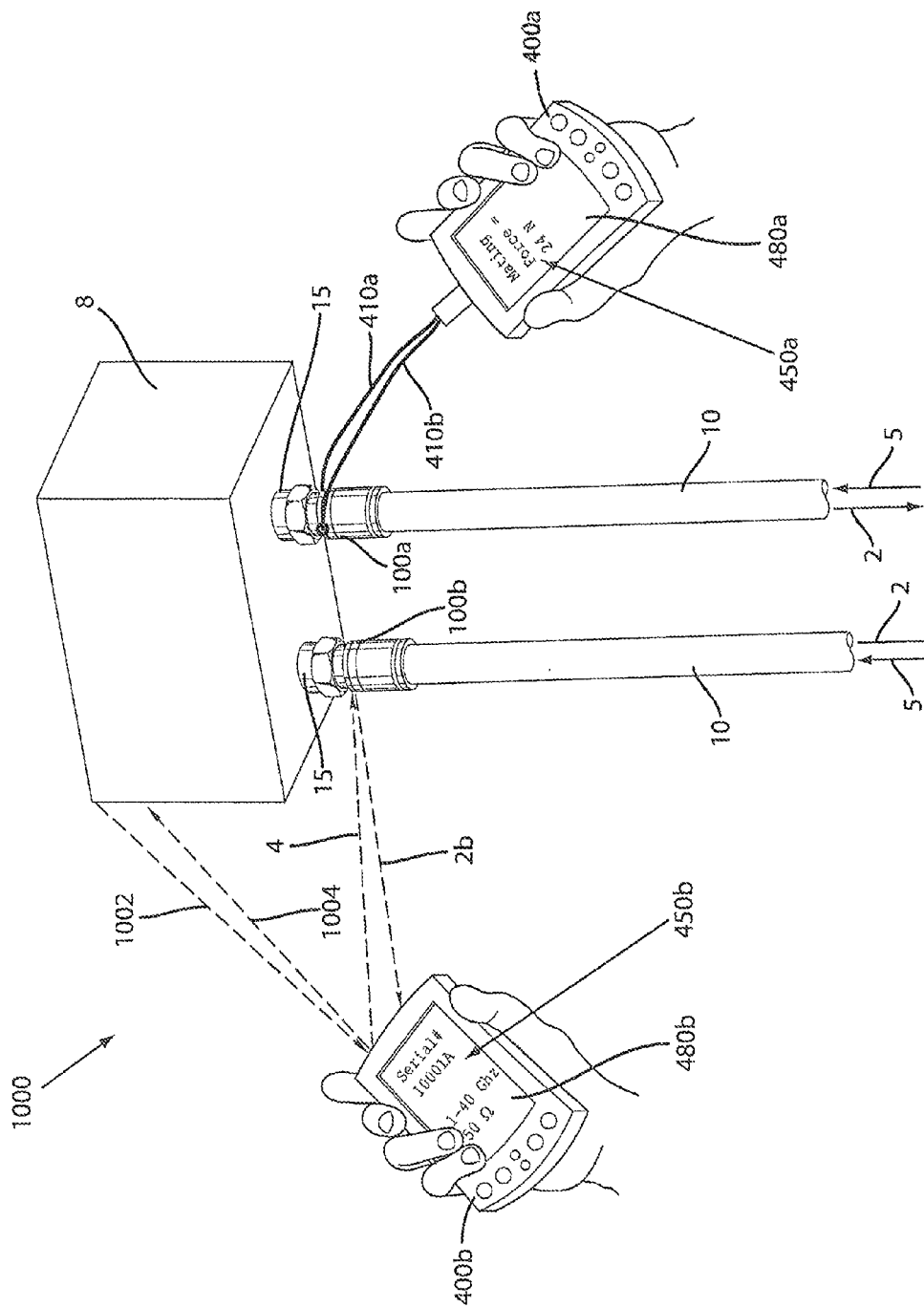
FIG. 5 depicts a schematic view of an embodiment of a coaxial cable connector connection system, in accordance with the present invention.

Referring further to FIGS. 1-4B and with additional reference to FIG. 5 embodiments of a coaxial cable connection system 1000 may include a physical parameter status/electrical parameter reader 400 located externally to the connector 100. The reader 400 is configured to receive, via the status output component 20 (of FIG. 4A) or directional coupler 373 (of FIG. 4B), information from the sensing circuit 30. Another embodiment of a reader 400 may be an output signal 2 monitoring device located somewhere along the cable line to which the connector 100 is attached. For example, a physical parameter status may be reported through an output component 20 in electrical communication with the center conductor of the cable 10. Then the reported status may be monitored by an individual or a computer-directed program at the cable-line head end to evaluate the reported physical parameter status and help maintain connection performance. The connector 100 may ascertain connection conditions and may transmit physical parameter status information or an electrical parameter of an electrical signal automatically at regulated time intervals, or may transmit information when polled from a central location, such as the head end (CMTS), via a network using existing technology such as modems, taps, and cable boxes. A reader 400 may be located on a satellite operable to transmit signals to a connector 100. Alternatively, service technicians could request a status report and read sensed or stored physical parameter status information (or electrical parameter information) onsite at or near a connection location, through wireless hand devices, such as a reader 400b, or by direct terminal connections with the connector 100, such as by a reader 400a. Moreover, a service technician could monitor connection performance via transmission over the cable line through other common coaxial communication implements such as taps, set tops, and boxes.

Operation of a connector 100 can be altered through transmitted input signals 5 from the network or by signals transmitted onsite near a connector 100 connection. For example, a service technician may transmit a wireless input signal 4 from a reader 400b, wherein the wireless input signal 4 includes a command operable to initiate or modify functionality of the connector 100. The command of the wireless input signal 4 may be a directive that triggers governing protocol of the control logic unit 32 to execute particular logic operations that control connector 100 functionality. The service technician, for instance, may utilize the reader 400b to command the connector 100, through a wireless input component 300, to presently sense a connection condition 1c related to current moisture presence, if any, of the connection. Thus the control logic unit 32 may communicate with the humidity sensor 31c, which in turn may sense a moisture condition 1c of the connection. The sensing circuit 30 could then report a real-time physical parameter status related to moisture presence of the connection by dispatching an output signal 2 through an output component 20 and back to the reader 400b located outside of the connector 100. The service technician, following receipt of the moisture monitoring report, could then transmit another input signal 4 communicating a command for the connector 100 to sense and report physical parameter status related to moisture content twice a day at regular intervals for the next six months. Later, an input signal 5 originating from the head end may be received through an input component 300 in electrical communication with the center conductor contact 80 to modify the earlier command from the service technician. The later-received input signal 5 may include a command for the connector 100 to only report a physical parameter status pertaining to moisture once a day and then store the other moisture status report in memory 33 for a period of 20 days.

Figure 6:
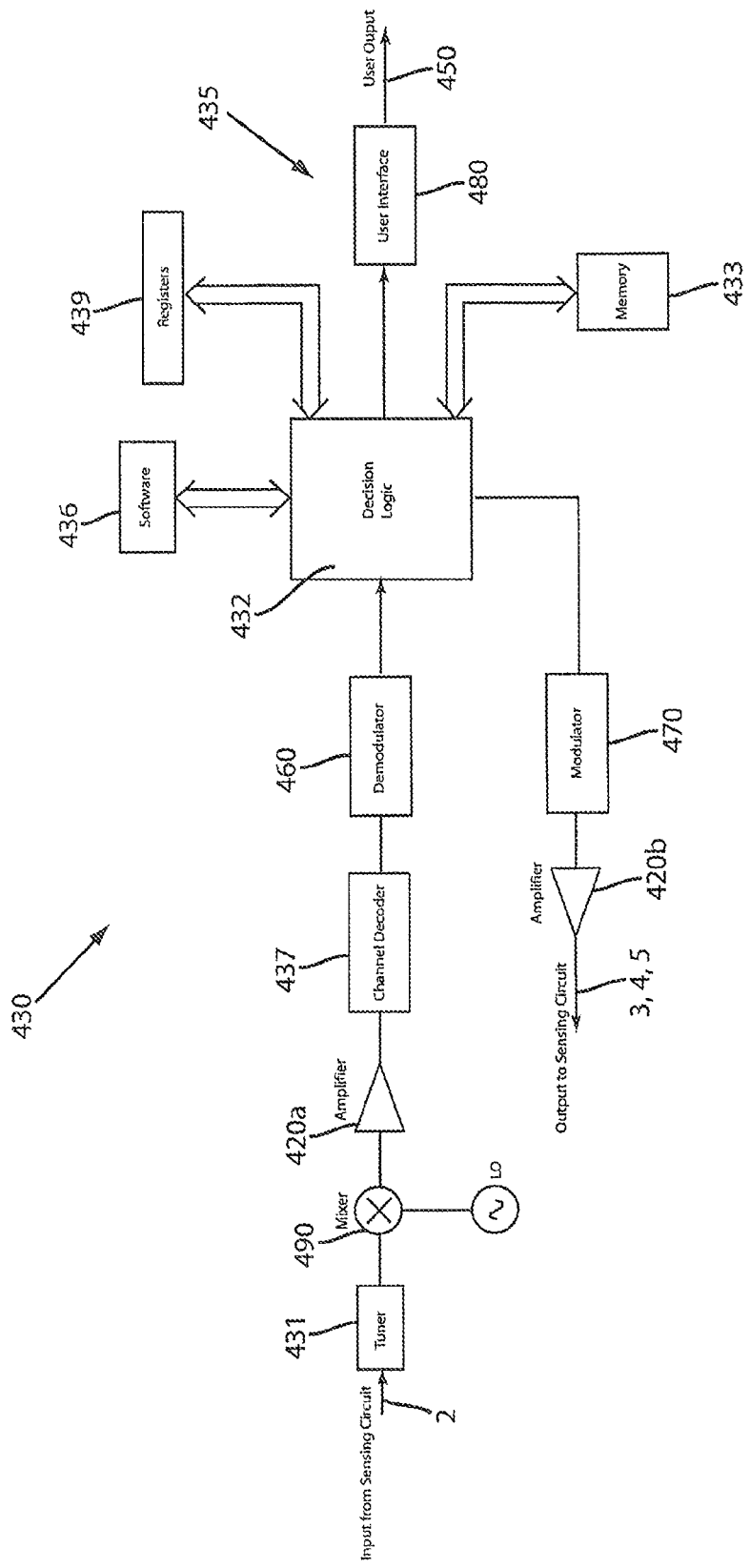
FIG. 6 depicts a schematic view of an embodiment of a reader circuit, in accordance with the present invention.

With continued reference to the drawings, FIG. 6 depicts a schematic view of an embodiment of a reader circuit 430. Those in the art should appreciate that the overall configuration of the depicted reader circuit 430 is exemplary. The various operable components included in the depicted reader circuit 430 are also included for exemplary purposes. Other reader circuit configurations including other components may be operably employed to facilitate communication of a reader, such as a reader 400, with a connector 100. A reader circuit 430 may include a tuner 431 configured to modify a received signal input, such as an output signal 2 transmitted from a connector 100, and convert the output signal 2 to a form suitable for possible further signal processing. The reader circuit 430 may also include a mixer 490 configured to alter, if necessary, the carrier frequency of the received output signal 2. An amplifier 420a may be included in a reader circuit 430 to modify the signal strength of the received output signal 2. The reader circuit 430 may further include a channel decoder 437 to decode, if necessary, the received output signal 2 so that applicable physical parameter status information may be retrieved. Still further, the reader circuit 430 may include a demodulator 460 in electrical communication with a decision logic unit 432. The demodulator 460 may be configured to recover information content from the carrier wave of the received output signal 2.

A decision logic unit 432 of an embodiment of a reader circuit 430 may include or operate with protocol to govern what, if any, actions can/should be taken with regard to the received physical parameter status output signal 2 following its electrical communication to the decision logic unit 432. The decision logic unit 432 may be a microprocessor or any other electrical component or electrical circuitry capable of processing a signal based on governing logic. A memory unit 433, may be in electrical communication with the control logic unit 432. The memory unit 433 may store information related to received output signals 2. The stored output signal 2 information may then be later communicated or processed by the decision logic unit 432 or otherwise operated on by the reader circuit 430. Furthermore the memory unit 433 may be a component or device that may store governing protocol. The reader circuit 430 may also comprise software 436 operable with the decision logic unit 432. The software 433 may comprise governing protocol. Stored protocol information, such as software 433, that may help govern decision logic operations may comprise a form of stored program architecture versatile for processing over some interval of time. The decision logic unit 432 may be in operable electrical communication with one or more registers 439. The registers 439 may be integral to the decision logic unit 432, such as microcircuitry on a microprocessor. The registers 439 generally contain and/or operate on signal information that the decision logic unit 432 may use to carry out reader circuit 430 functions, possibly according to some governing protocol. For example, the registers 439 may be switching transistors integrated on a microprocessor, and functioning as electronic "flip-flops".

A reader circuit 30 may include and/or be otherwise operable with a user interface 435 that may be in electrical communication with the decision logic unit 432 to provide user output 450. The user interface 435 is a component facilitating the communication of information to a user such as a service technician or other individual desiring to acquire user output 450, such as visual or audible outputs. For example, as depicted in FIG. 5, the user interface 435 may be an LCD screen 480a of a reader 400a. The LCD screen 480a may interface with a user by displaying user output 450a in the form of visual depictions of determined physical parameter status corresponding to a received output signal 2b. For instance, a service technician may utilize a reader 400a to communicate with a connector 100a and demand a physical parameter status applicable to connection tightness. Once a condition, such as connection tightness condition 1a is determined by the sensing circuit 30 of the connector 100a, then a corresponding output signal 2 may be transmitted via the output component 20 of the connector 100a through a wire lead 410a and/or 410b to the reader 400a.

A reader 400 utilizes information pertaining to a reported physical parameter status to provide a user output 450 viewable on a user interface 480. For instance, following reception of the output signal 2 by the reader 400a, the reader circuit 430 may process the information of the output signal 2 and communicate it to the user interface LCD screen 480 as user output 450 in the form of a visual depiction of a physical parameter status indicating that the current mating force of the connection of the connector 100a is 24 Newtons. Similarly, a wireless reader 400b may receive a wireless output signal transmission 2b and facilitate the provision of a user output 450 in the form of a visual depiction of a physical parameter status indicating that the connector 100b has a serial number 10001A and is specified to operate for cable communications between 1-40 gigahertz and up to 50 ohms. Those in the art should recognize that other user interface components such as speakers, buzzers, beeps, LEDs, lights, and other like means may be provided to communicate information to a user. For instance, an operator at a cable-line head end may hear a beep or other audible noise, when a reader 400, such as a desktop computer reader embodiment, receives an output signal 2 from a connector 100 (possibly provided at a predetermined time interval) and the desktop computer reader 400 determines that the information corresponding to the received output signal 2 renders a physical parameter status that is not within acceptable performance standards. Thus the operator, once alerted by the user output 450 beep to the unacceptable connection performance condition, may take steps to further investigate the applicable connector 100.

Communication between a reader 400 and a connector 100 may be facilitated by transmitting input signals 3, 4, 5 from a reader circuit 430. The reader circuit 430 may include a signal modulator 470 in electrical communication with the decision logic unit 432. The modulator 470 may be configured to vary the periodic waveform of an input signal 3, 4, 5 to be transmitted by the reader circuit 430. The strength of the input signal 3, 4, 5 may be modified by an amplifier 420b prior to transmission. Ultimately the input signal 3, 4, 5 from the reader circuit 430 is transmitted to an input component 300 in electrical communication with a sensing circuit 30 of a connector 100. Those in the art should appreciate that the input component 300 may be a part of the sensing circuit 30. For example the input component 300 may be an initial lead, trace, wire, or other electrical conduit leading from a signal entrance location of a connector 100 to the sensing circuit 30.

A coaxial cable connector connection system 1000 may include a reader 400 that is communicatively operable with devices other than a connector 100. The other devices may have greater memory storage capacity or processor capabilities than the connector 100 and may enhance communication of physical parameter status by the connector 100. For example, a reader 400 may also be configured to communicate with a coaxial communications device such as a receiving box 8. The receiving box 8, or other communications device, may include means for electromagnetic communication exchange with the reader 400. Moreover, the receiving box 8, may also include means for receiving and then processing and/or storing an output signal 2 from a connector 100, such as along a cable line. In a sense, the communications device, such as a receiving box 8, may be configured to function as a reader 400 being able to communicate with a connector 100. Hence, the reader-like communications device, such as a receiving box 8, can communicate with the connector 100 via transmissions received through an input component 300 connected to the center conductor contact 80 of the connector. Additionally, embodiments of a reader-like device, such as a receiving box 8, may then communicate information received from a connector 100 to another reader 400. For instance, an output signal 2 may be transmitted from a connector 100 along a cable line to a reader-like receiving box 8 to which the connector is communicatively connected. Then the reader-like receiving box 8 may store physical parameter status information pertaining to the received output signal 2. Later a user may operate a reader 400 and communicate with the reader-like receiving box 8 sending a transmission 1004 to obtain stored physical parameter status information via a return transmission 1002.

Alternatively, a user may operate a reader 400 to command a reader-like device, such as a receiving box 8 communicatively connected to a connector 100, to further command the connector 100 to report a physical parameter status receivable by the reader-like receiving box 8 in the form of an output signal 2. Thus by sending a command transmission 1004 to the reader-like receiving box 8, a communicatively connected connector 100 may in turn provide an output signal 2 including physical parameter status information that may be forwarded by the reader-like receiving box 8 to the reader 400 via a transmission 1002. The coaxial communication device, such as a receiving box 8, may have an interface, such as an RF port 15, to which the connector 100 is coupled to form a connection therewith.

A coaxial cable connector 100 comprises means for monitoring a physical parameter status of a connection of the connector 100. The physical parameter status monitoring means may include internal circuitry that may sense connection conditions, store data, and/or determine monitorable variables of physical parameter status through operation of a physical parameter status sensing circuit 30. A sensing circuit 30 may be integrated onto typical coaxial cable connector components. The sensing circuit 30 may be located on existing connector structures, such as on a face 42 of a first spacer 40 of the connector 100. The physical parameter status sensing circuit 30 is configured to sense a condition of the connector 100 when the connector 100 is connected with an interface of a common coaxial cable communications device, such as RF interface port 15 of receiving box 8 (see FIG. 5).

A coaxial cable connector 100 comprises means for reporting the physical parameter status of the connection of the connector 100 to another device having a connection interface, such as an RF port. The means for reporting the physical parameter status of the connection of the connector 100 may be integrated onto existing connector components. The physical parameter status reporting means are configured to report the physical parameter status to a location outside of a connector body 50 of the connector 100. The physical parameter status reporting means may include a status output component 20 positioned within the connector body 50 and configured to facilitate the dispatch of information pertaining to a connection condition 1 sensed by a sensor 30 of a sensing circuit 30 and reportable as a physical parameter status of the connection of a connector 100. Sensed physical parameter status information may be passed as an output signal 2 from the sensing circuit 30 located on a connector component, such as first spacer 40, through the output component 20, comprising a trace or other conductive element electrically linked to the center conductor contact 80. The outputted signal(s) 2 can then travel outside of the connector 100 along the cable line (see FIG. 5) corresponding to the cable connection applicable to the connector 100.

Alternatively, the connection performance reporting means may include an output component 20 configured to facilitate wired transmission of an output signal 2 to a location outside of the connector 100. The physical parameter status reporting means may include a status output component 20 positioned within the connector body 50 and configured to facilitate the dispatch of information pertaining to a connection condition 1 sensed by a sensor 31 of a sensing circuit 30 and reportable as a physical parameter status of the connection of a connector 100. Sensed physical parameter status information may be passed as an output signal 2 from the sensing circuit 30 located on a connector component, such as first spacer 40, through the output component 20, comprising a trace or other conductive element that is physically accessible by a communications device, such as a wire lead 410 from a reader 400a (see FIG. 5). The sensing circuit 30 may be electrically linked by traces, leads, wires, or other electrical conduits located within a connector 100a to electrically connect an external communications device, such as the handheld reader 400a. An output signal 2 from the sensing circuit 30 may dispatch through the output component 20 to a reader 400a located outside of the connector, wherein the reader 400a receives the output signal 2 through a wire lead 410 in electrical contact with the connector 100a. The handheld reader 400a may be in physical and electrical communication with the connector 100 through the wire lead 410 contacting the connector 10.

As a still further alternative, the physical parameter status reporting means may include an output component 20 configured to facilitate wireless transmission of an output signal 2 to a location outside of the connector 100. For example the output component 20 may comprise a wireless transmitter capable of transmitting electromagnet signals, such as, radiowaves, Wi-fi transmissions, RFID transmissions, satellite transmissions, Bluetooth™ wireless transmissions, and the like. Accordingly, an output signal, such as wireless output signal 2b depicted in FIG. 5, may be reported from the sensing circuit 30 and dispatched through the output component 20 to a device outside of the connector 100, such as a wireless reader 400b.

A sensing circuit 30 may be calibrated. Calibration may be efficiently performed for a multitude of sensing circuits similarly positioned in connectors 100 having substantially the same configuration. For example, because a sensing circuit 30 may be integrated onto a typical component of a connector 100, the size and material make-up of the various components of the plurality of connectors 100 can be substantially similar. As a result, a multitude of connectors 100 may be batch-fabricated and assembled to each have substantially similar structure and physical geometry. Accordingly, calibration of a sensing circuit 30 may be approximately similar for all similar connectors fabricated in a batch. Furthermore, the sensing circuit 30 of each of a plurality of connectors 100 may be substantially similar in electrical layout and function. Therefore, the electrical functionality of each similar sensing circuit 30 may predictably behave in accordance to similar connector 100 configurations having substantially the same design, component make-up, and assembled geometry. Accordingly, the sensing circuit 30 of each connector 100 that is similarly mass-fabricated, having substantially the same design, component make-up, and assembled configuration, may not need to be individually calibrated. Calibration may be done for an entire similar product line of connectors 100. Periodic testing can then assure that the calibration is still accurate for the line. Moreover, because the sensing circuit 30 may be integrated into existing connector components, the connector 100 can be assembled in substantially the same way as typical connectors and requires very little, if any, mass assembly modifications.

Various connection conditions 1 pertinent to the connection of a connector 100 may be determinable by a sensing circuit 30 because of the position of various sensors 31 within the connector 100. Sensor 31 location may correlate with the functionality of the various portions or components of the connector 100. For example, a sensor 31a configured to detect a connection tightness condition 1a may be positioned near a connector 100 component that contacts a portion of a mated connection device, such as an RF interface port 15 of receiving box 8 (see FIG. 5); while a humidity sensor 31c configured to detect a moisture presence condition 1c may be positioned in a portion of the connector 100 that is proximate the attached coaxial cable 10 that may have moisture included therein, which may enter the connection.

The various components of a connector 100 assembly create a sandwich of parts, similar to a sandwich of parts existent in typical coaxial cable connectors. Thus, assembly of a connector 100 having an integral sensing circuit 30 may be no different from or substantially similar to the assembly of a common coaxial cable connector that has no sensing circuit 30 built in. The substantial similarity between individual connector 100 assemblies can be very predictable due to mass fabrication of various connector 100 components. As such, the sensing circuits 30 of each similarly configured connector 100 may not need to be adjusted or calibrated individually, since each connector 100, when assembled, should have substantially similar dimension and configuration. Calibration of one or a few connectors 100 of a mass-fabricated batch may be sufficient to render adequate assurance of similar functionality of the other untested/uncalibrated connectors 100 similarly configured and mass produced.

Referring to FIGS. 1-6 a coaxial cable connector physical parameter status ascertainment method is described. A coaxial cable connector 100 is provided. The coaxial cable connector 100 has a connector body 50. Moreover, a sensing circuit 30 is provided, wherein the sensing circuit 30 is housed within the connector body 50 of the connector 100. The sensing circuit has a sensor 31 configured to sense a physical parameter of the connector 100 when connected. In addition, a physical parameter status output component 20 is provided within the connector body 50. The status output component 20 is in communication with the sensing circuit 30 to receive physical parameter status information. Further physical parameter status ascertainment methodology includes connecting the connector 100 to an interface, such as RF port 15, of another connection device, such as a receiving box 8, to form a connection. Once the connection is formed, physical parameter status information applicable to the connection may be reported, via the status output component 20, to facilitate conveyance of the physical parameter status of the connection to a location outside of the connector body 50.

A further connection status ascertainment step may include sensing a physical parameter status of the connector 100 connection, wherein the sensing is performed by the sensing circuit 30. In addition, reporting physical parameter status to a location outside of the connector body 50, may include communication of the status to another device, such as a handheld reader 400, so that a user can obtain the ascertained physical parameter status of the connector 100 connection.

Physical parameter status ascertainment methodology may also comprise the inclusion of an input component 300 within the connector 100. Still further, the ascertainment method may include transmitting an input signal 3, 4, 5 from a reader 400 external to the input component 300 of the connector 100 to command the connector 100 to report a physical parameter status. The input signal 5 originates from a reader 400 at a head end of a cable line to which the connector 100 is connected. The input signals 3, 4 originate from a handheld reader 400a, 400b possibly operated by a service technician located onsite near where the connector 100 is connected.

It is important that a coaxial cable connector be properly connected or mated to an interface port of a device for cable communications to be exchanged accurately. One way to help verify whether a proper connection of a coaxial cable connector is made is to determine and report mating force in the connection. Common coaxial cable connectors have been provided, whereby mating force can be determined. However, such common connectors are plagued by inefficient, costly, and impractical considerations related to design, manufacture, and use in determining mating force. Accordingly, there is a need for an improved connector for determining mating force. Various embodiments of the present invention can address the need to efficiently ascertain mating force and maintain proper physical parameter status relative to a connector connection. Additionally, it is important to determine the humidity status of the cable connector and report the presence of moisture.

Figure 7:
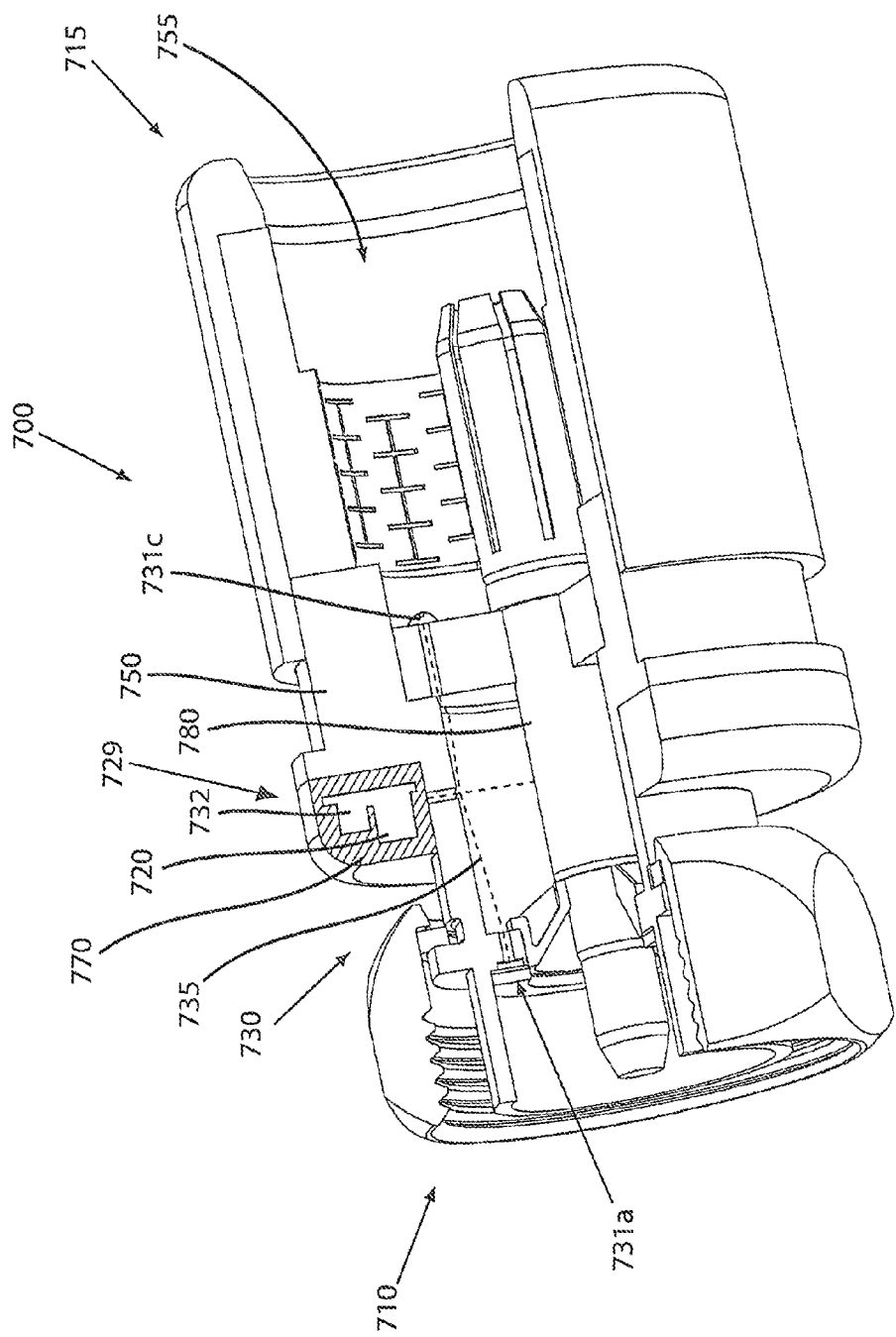
FIG. 7 depicts a side perspective cut-away view of an embodiment of a coaxial cable connector having a force sensor and a humidity sensor.

Referring to the drawings, FIG. 7 depicts a side perspective cut-away view of an embodiment of a coaxial cable connector 700 having a mating force sensor 731a and a humidity sensor 731c. The connector 700 includes port connection end 710 and a cable connection end 715. In addition, the connector 700 includes sensing circuit 730 operable with the mating force sensor 731a and the humidity sensor or moisture sensor 731c. The mating force sensor 731a and the humidity sensor 731c may be connected to a processor control logic unit 732 operable with an output transmitter 720 through leads, traces, wires, or other electrical conduits depicted as dashed lines 735. The sensing circuit electrically links the mating force sensor 731a and the humidity sensor 731c to the processor control logic unit 732 and the output transmitter 729. For instance, the electrical conduits 735 may electrically tie various components, such as the processor control logic unit 732, the sensors 731a, 731c and an inner conductor contact 780 together.

The processor control logic unit 732 and the output transmitter 720 may be housed within a weather-proof encasement 770 operable with a portion of the body 750 of the connector 700. The encasement 770 may be integral with the connector body portion 750 or may be separately joined thereto. The encasement 770 should be designed to protect the processor control logic unit 732 and the output transmitter 720 from potentially harmful or disruptive environmental conditions. The mating force sensor 731a and the humidity sensor 731c are connected via a sensing circuit 730 to the processor control logic unit 732 and the output transmitter 720.

The mating force sensor 731a is located at the port connection end 710 of the connector 700. When the connector 700 is mated to an interface port, such as port 15 shown in FIG. 4, the corresponding mating forces may be sensed by the mating force sensor 731a. For example, the mating force sensor 731a may comprise a transducer operable with an actuator such that when the port, such as port 15, is mated to the connector 700 the actuator is moved by the forces of the mated components causing the transducer to convert the actuation energy into a signal that is transmitted to the processor control logic unit 732. The actuator and/or transmitter of the mating force sensor 731a may be tuned so that stronger mating forces correspond to greater movement of the actuator and result in higher actuation energy that the transducer can send as a stronger signal. Hence, the mating force sensor 731a may be able to detect a variable range or mating forces.

The humidity sensor 731c is located within a cavity 755 of the connector 700, wherein the cavity 755 extends from the cable connection end 715 of the connector 700. The moisture sensor 731c may be an impedance moisture sensor configured so that the presence of water vapor or liquid water that is in contact with the sensor 731c hinders a time-varying electric current flowing through the humidity sensor 731c. The humidity sensor 731c is in electrical communication with the processor control logic unit 732, which can read how much impedance is existent in the electrical communication. In addition, the humidity sensor 731c can be tuned so that the contact of the sensor with water vapor or liquid water, the greater the measurable impedance. Thus, the humidity sensor 731c may detect a variable range or humidity and moisture presence corresponding to an associated range of impedance thereby. Accordingly, the humidity sensor 731c can detect the presence of humidity within the cavity 755 when a coaxial cable, such as cable 10 depicted in FIG. 4, is connected to the cable connection end 715 of the connector 700.

Figure 8:
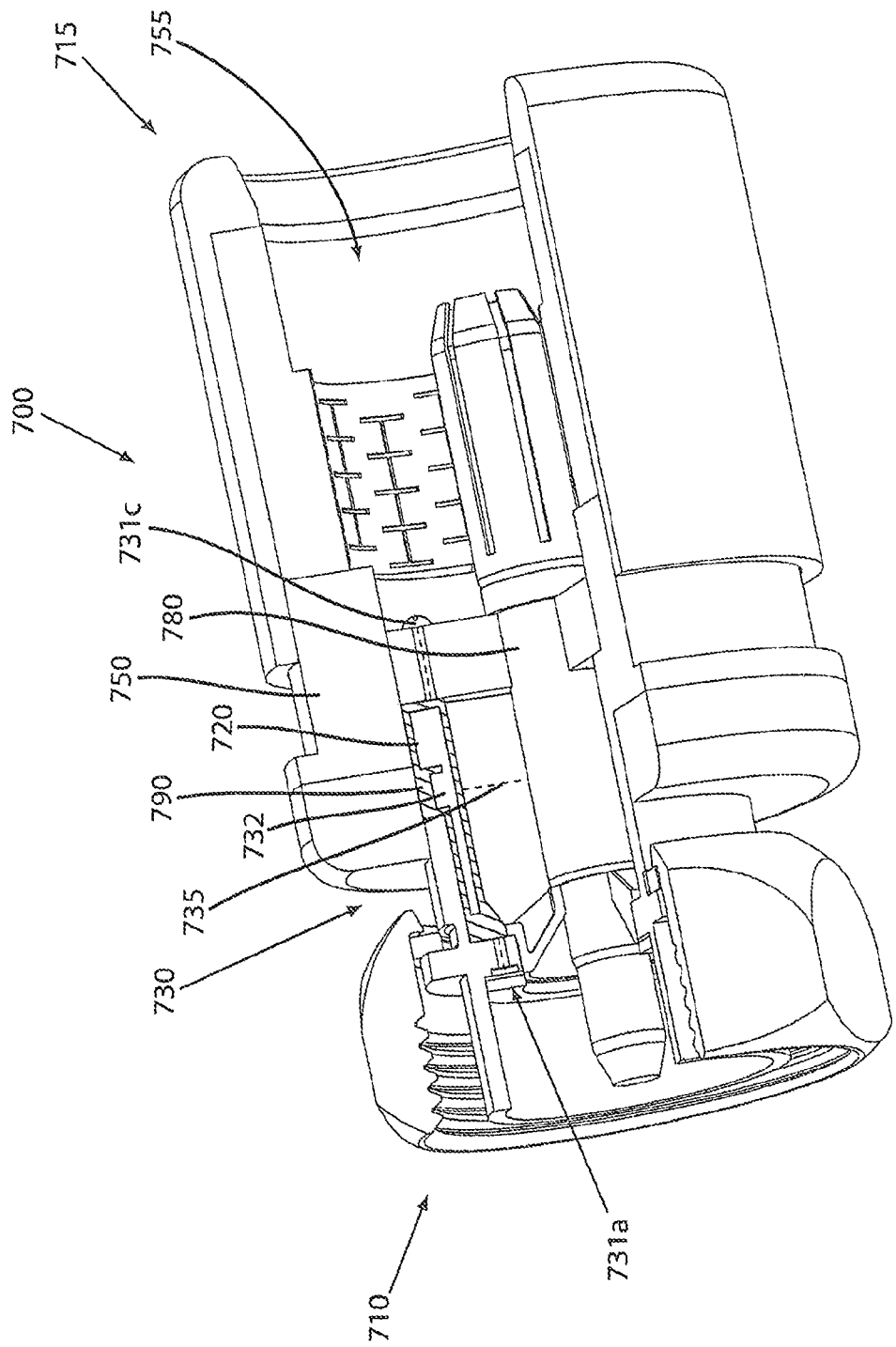
FIG. 8 depicts a side perspective cut-away view of another embodiment of a coaxial cable connector having a force sensor and a humidity sensor.

Another embodiment of a coaxial cable connector 700 having a force sensor 731a and a humidity sensor 731c is depicted in FIG. 8. The mating force sensor 731a and the humidity sensor 731c of the connector 700 shown in FIG. 8 may function be the same as, or function similarly to, the mating force sensor 731a and the humidity sensor 731c of the connector 700 shown in FIG. 7. For example, the mating force sensor 731a and the humidity sensor 731c are connected via a sensing circuit 730 to the processor control logic unit 732 and the output transmitter 720. The sensing circuit 730 electrically links the mating force sensor 731a and the humidity sensor 731c to the control logic unit and the output transmitter. However, in a manner different from the embodiment of the connector 700 depicted in FIG. 7, the processor control logic unit 732 and the output transmitter 720 may be housed within an EMI/RFI shielding/absorbing encasement 790 in the embodiment of a connector 700 depicted in FIG. 8. The EMI/RFI shielding/absorbing encasement 790 may be located radially within a body portion 750 of the connector 700. The processor control logic unit 732 and the output transmitter 720 may be connected to a through leads, traces, wires, or other electrical conduits depicted as dashed lines 735 to the mating force sensor 731a and the humidity sensor 731c. The electrical conduits 735 may electrically link various components, such as the processor control logic unit 732, the sensors 731a, 731c and an inner conductor contact 780.

Power for the sensing circuit 730, processor control unit 732, output transmitter 720, mating force sensor 731a, and/or the humidity sensor 731c of embodiments of the connector 700 depicted in FIG. 7 or 8 may be provided through electrical contact with the inner conductor contact 780. For example, the electrical conduits 735 connected to the inner conductor contact 780 may facilitate the ability for various connector 700 components to draw power from the cable signal(s) passing through the inner connector contact 780. In addition, electrical conduits 735 may be formed and positioned so as to make contact with grounding components of the connector 700.

The output transmitter 720, of embodiments of a connector 700 depicted in FIGS. 7-8, may propagate electromagnetic signals from the connector 700 to a source external to the connector 700. For example, the output transmitter 720 may be a radio transmitter providing signals within a particular frequency range that can be detected following emission from the connector 700. The output transmitter 720 may also be an active RFID device for sending signals to a corresponding reader external to the connector 700. In addition, the output transmitter 720 may be operably connected to the inner conductor contact 780 and may transmit signals through the inner conductor contact 780 and out of the connector 700 along the connected coaxial cable, such as cable 10 (see FIG. 4A) to a location external to the connector 700.

With continued reference to FIGS. 1-8, there are numerous means by which a connector, such as connector 100 or connector 700, may ascertain whether it is appropriately tightened to an RF port, such as RF port 15, of a cable communications device. In furtherance of the above description with reference to the smart connector 100 or 700, FIGS. 9-12b are intended to disclose various exemplary embodiments of a smart connector 800 having connection tightness detection means. A basic sensing method may include the provision of a connector 800 having a sensing circuit, which simply monitors the typical ground or shield path of the coaxial cable connection for continuity. Any separation of the connector ground plane from the RF interface port 815 would produce an open circuit that is detectable. This method works well to detect connections that are electrically defective. However, this method may not detect connections that are electrically touching but still not tight enough. In addition, this method may not detect whether the mating forces are too strong between the connected components and the connection is too tight and possibly prone to failure.

Figure 9:
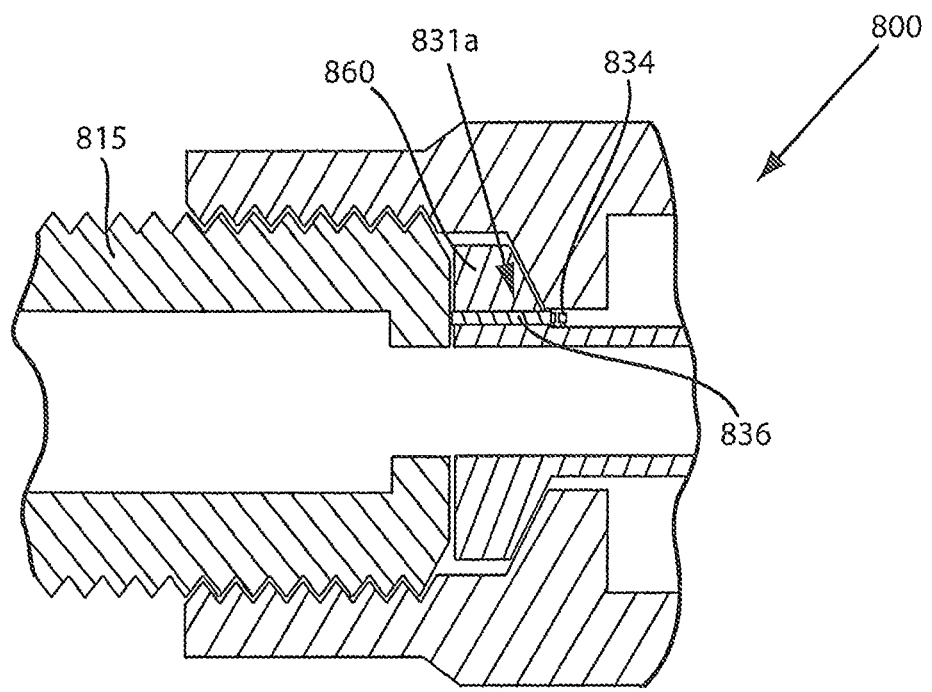
FIG. 9 depicts a partial side cross-sectional view of an embodiment a connector mated to an RF port, the connector having a mechanical connection tightness sensor, in accordance with the present invention.

Connection tightness may be detected by mechanical sensing, as shown by way of example in FIG. 9, which depicts a partial side cross-sectional view of an embodiment a connector 800 mated to an RF port 815, the connector 800 having a mechanical connection tightness sensor 831a. The mechanical connection tightness sensor 831a may comprise a movable element 836. The movable element 836 is located to contact the interface port 815 when the connector 800 is tightened thereto. For example, the movable element 836 may be a push rod located in a clearing hole positioned in a interface component 860, such as a central post having a conductive grounding surface, or other like components of the connector 800. The movable element 836, such as a push rod, may be spring biased. An electrical contact 834 may be positioned at one end of the range of motion of the moveable element 836. The electrical contact 834 and movable element 836 may comprise a micro-electro-mechanical switch in electrical communication with a sensing circuit, such as sensing circuit 30. Accordingly, if the connector 800 is properly tightened the movable element 836 of the connection tightness sensor 831a will be mechanically located in a position where the contact 834 is in one state (either open or closed, depending on circuit design). If the connector 800 is not tightened hard enough onto the RF interface port 815, or the connector 800 is tightened too much, then the movable element 836 may or may not (depending on circuit design) electrically interface with the contact 834 causing the contact 834 to exist in an electrical state coordinated to indicate an improper connection tightness.

Figure 10:
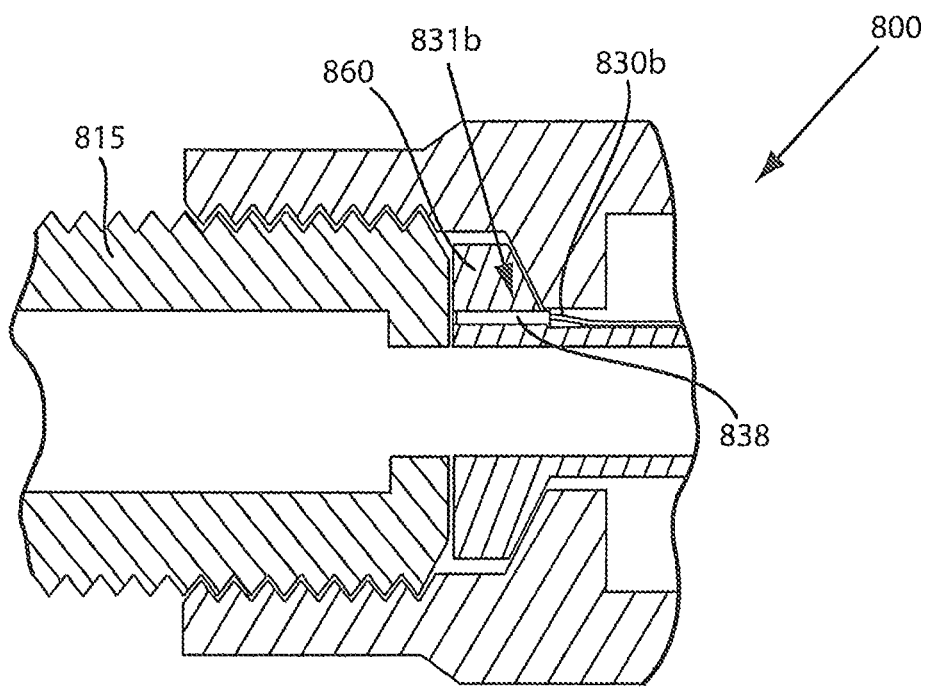
FIG. 10 depicts a partial side cross-sectional view of an embodiment a connector mated to an RF port, the connector having an electrical proximity connection tightness sensor, in accordance with the present invention.

Connection tightness may be detected by electrical proximity sensing, as shown by way of example in FIG. 10, which depicts a partial side cross-sectional view of an embodiment a connector 800 mated to an RF port 815, the connector 800 having an electrical proximity connection tightness sensor 831b. The electrical proximity connection tightness sensor 831b may comprise an electromagnetic sensory device 838, mounted in such as way as to electromagnetically detect the nearness of the connector 800 to the RF interface port 815. For example, the electromagnetic sensory device 838 may be an inductor or capacitor that may be an inductor located in a clearing hole of an interface component 860, such as a central post, of the connector 800. An electromagnetic sensory device 838 comprising an inductor may be positioned to detect the ratio of magnetic flux to any current (changes in inductance) that occurs as the connector 800 is mounted to the RF port 815. The electromagnetic sensory device 838 may be electrically coupled to leads 830b that run to additional sensing circuitry of the connector 800. Electrical changes due to proximity or tightness of the connection, such as changes in inductance, may be sensed by the electromagnetic sensory device 838 and interpreted by an associated sensing circuit, such as sensing circuit 30. Moreover, the electromagnet sensory device may comprise a capacitor that detects and stores an amount of electric charge (stored or separated) for a given electric potential corresponding to the proximity or tightness of the connection. Accordingly, if the connector 800 is properly tightened the electromagnetic sensory device 838 of the electrical proximity connection tightness sensor 831b will detect an electromagnet state that is not correlated with proper connection tightness. The correlation of proper electromagnetic state with proper connection tightness may be determined through calibration of the electrical proximity connection tightness sensor 831b.

Connection tightness may be detected by optical sensing, as shown by way of example in FIGS. 11A and 11B, which depict a partial side cross-sectional view of an embodiment a connector 800 mated to an RF port 815, the connector 800 having an optical connection tightness sensor 831c. The optical connection tightness sensor 831c may utilize interferometry principles to gauge the distance between the connector 800 and a mounting face 816 of an RF interface port 815. For instance, the optical connection tightness sensor 831c may include an emitter 833. The emitter 833 could be mounted in a portion of an interface component 860, such as interface end of a central post, so that the emitter 833 could send out emissions 835 in an angled direction toward the RF interface port 815 as it is being connected to the connector 800. The emitter could be a laser diode emitter, or any other device capable of providing reflectable emissions 835. In addition, the optical connection tightness sensor 831c may include a receiver 837. The receiver 837 could be positioned so that it receives emissions 835 reflected off of the interface port 815. Accordingly, the receiver 837 may be positioned in the interface component 860 at an angle so that it can appropriately receive the reflected emissions 835. If the mounting face 816 of the interface port is too far from the optical connection tightness sensor 831c, then none, or an undetectable portion, of emissions 835 will be reflected to the receiver 837 and improper connection tightness will be indicated. Furthermore, the emitter 833 and receiver 837 may be positioned so that reflected emissions will comprise superposing (interfering) waves, which create an output wave different from the input waves; this in turn can be used to explore the differences between the input waves and those differences can be calibrated according to tightness of the connection. Hence, the when the optical connection tightness sensor 831c detects interfering waves of emissions 835 corresponding to accurate positioning of the RF interface port 815 with respect to the connector 800, then a properly tightened connection may be determined.

Connection tightness may be detected by strain sensing, as shown by way of example in FIGS. 12A and 12B, which depict a partial side cross-sectional view of an embodiment a connector 800 mated to an RF port 815, the connector 800 having a strain connection tightness sensor 831d, as connected to further electrical circuitry 832. The strain connection tightness sensor 831d includes a strain gauge 839. The strain gauge 839 may be mounted to a portion of an interface component 860 that contacts the RF port 815 when connected. For instance, the strain gauge 839 may be positioned on an outer surface of an interface component 860 comprising a central post of the connector 800. The strain gauge may be connected (as shown schematically in FIG. 16a) through leads or traces 830d to additional circuitry 832. The variable resistance of the strain gauge 839 may rise or fall as the interface component 860 deforms due to mating forces applied by the interface port 815 when connected. The deformity of the interface component 860 may be proportional to the mating force. Thus a range of connection tightness may be detectable by the strain connection tightness sensor 831d. Other embodiments of the strain connection tightness sensor 831d may not employ a strain gauge 839. For instance, the interface component 860 may be formed of material that has a variable bulk resistance subject to strain. The interface component 860 could then serve to sense mating force as resistance changed due to mating forces when the connector 800 is tightened to the RF port 815. The interface component 860 may be in electrical communication with additional circuitry 832 to relay changes in resistance as correlated to connection tightness. Still further embodiments of a strain connection tightness sensor may utilize an applied voltage to detect changes in strain. For example, the interface component 860 may be formed of piezoelastic/electric materials that modify applied voltage as mating forces are increased or relaxed.

Cost effectiveness may help determine what types of physical parameter status, such as connection tightness or humidity presence, are ascertainable by means operable with a connector 100, 700, 800. Moreover, physical parameter status ascertainment may include provision detection means throughout an entire connection. For example, it should be understood that the above described means of physical parameter status determination may be included in the smart connector 100, 700, 800 itself, or the physical status determination means may be included in combination with the port, such as RF interface port 15, 815, to which the connector 100, 700, 800 is connected (i.e., the RF port or an interim adapter may include sensors, such as sensors 31, 731, 831, that may be electrically coupled to a sensing circuit, such as circuit 30, of the connector 100, 700, 800, so that connection tightness may be ascertained).

As shown in FIGS. 13A and 13B, a connection device 500, such as, for example, a diplexer, multiplexer, antenna, or equipment housing, may have smart RF interface ports 515 operatively coupled thereto. Specifically, the physical status determination and communication means described herein above, as well as the electrical signal determination and communication means described herein above can be incorporated, or integrated, into the RF interface ports 515 on the connection devices 500 such that the RF interface ports 515 exhibit the smart technology that has been described herein with respect to the physical and electrical determination and communication means. For example, a non-intelligent feeder cable 502, such as standard coaxial cable, can be operatively coupled to the connection device 500 either directly or indirectly. As shown in FIG. 13A, the feeder cable 502 is operatively coupled to the connection device 500 via a jumper 504. Having the physical status determination and communication means, as well as the electrical signal determination and communication means integrated on or incorporated into the RF interface ports 515 allows a user to connect the non-intelligent feeder cable 502 to a smart RF interface port 515 to provide the user the ability to request and retrieve physical conditions and electrical parameters of the connection between the non-intelligent feeder cable 502 and the smart RF interface port 515. Furthermore, referring again to FIGS. 13A and 13B, a user may place a smart connection device 500 having smart RF interface ports 515 thereon between the feeder cable 502 and antennae 506, such that the user can thereafter request and retrieve the physical and electrical conditions and parameters along the transmission line between the feeder cable 502 and the antennae 506.

In addition, as shown in FIGS. 14A-14B, a smart adapter 600 can be configured, in much the same way as the connectors 100, 700, and 800, to have the physical status determination and communication means described herein above, as well as the electrical signal determination and communication means described herein above incorporated, or integrated, therein. Also, the smart adapter 600 can have male and female ends for insertion between respective male and female components along a line of existing cable through which electrical signals are transmitted. For example, a smart adapter 600 can be placed between existing non-intelligent connectors 602 and 604 in an existing line of cable to assist a user in evaluating the electrical and physical connection along the transmission line of which connectors 602 and 604 are a part. This is done by disconnecting connectors 602 and 604 from one another and coupling the smart adapter 600 to each of the connectors 602 and 604, such that the smart adapter 600 completes the operative connection between the connectors 602 and 604. In this way, a user may place a smart adapter 600 between the connector 602 and the connector 604, such that the user can thereafter request and retrieve the physical and electrical conditions and parameters along the transmission line of which connectors 602 and 604 form a part. It will be understood by one of ordinary skill in the art that adapter 600 can be configured to be placed between a male connector and a female port, a female connector and a male port, male and female connectors, male and female ports, or any other variation, as the case may be.

The connection device 500 and the smart adapter 600 allow an established electrical connection or established RF electrical component to be retrofitted with the smart technology described herein. Established connections between pieces of cable, between cable and equipment, and between more than one piece of equipment can be replaced with connection device 500 and/or smart adapter 600 to allow the user to thereafter request and retrieve the physical and electrical conditions and parameters along the transmission line of which the connection device 500 and/or smart connector 600 becomes a part.

The smart technology can be positioned in either end of the smart adapter 600. In some embodiments, the smart technology can be positioned in each end of the smart adapter 600, in order to sense the physical and electrical connection between each end of the smart adapter 600. In other words, the smart technology that senses one or both of the physical connection and the electrical signal is not specific to one gender of coaxial component. In fact, the smart technology can be configured in either male or female ends of components. And, in some embodiments, the smart technology can be configured in opposing ends of components to allow the components to sense the physical connection and electrical signal in both ends of the component, whether both ends are male, female, or a combination of both.

Moreover, the connection device 500 and the smart adapter 600 allow RF components or coaxial cable components to be daisy chained together. For example, an antenna 506 can be directly coupled to the connection device 500 without the feeder cable 502 there between. Also, it can be advantageous to daisy chain diplexers and filters along a transmission line. The smart technology can be advantageous in these configurations to determine the specific component that needs to be replaced or the specific component that is causing the loss of signal, due to poor physical coupling with other components or poor transmission of the electrical signal. By having the smart technology available in components that are daisy chained together, it is possible to identify the non-performing component and replace it only, instead of having to replace the entire daisy chain.

Another advantage of placing smart technology in interface devices, such as the connection device 500 and the smart adapter 600, is that these smart connectors provide the user a glimpse into the performance of the transmission line, including the various components along the transmission line and the electrical signal passing along the line. For example, by allowing the user to request and retrieve a reading regarding the physical connection and the electrical signal at various locations along a transmission line, the connection device 500 and the smart adapter 600, as well as other smart components described above, allow the user to pinpoint where the physical connection is weak or disrupted along the transmission line, where the electrical signal is weak along the transmission line, or even where the electrical signal is lost, due to poor electrical coupling of connectors or poor physical coupling of connectors.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims. The claims provide the scope of the coverage of the invention and should not be limited to the specific examples provided herein.

What is claimed is:

1. A coaxial interface comprising:
an interface body;
a sensing circuit positioned within the interface body, wherein the sensing circuit is configured to sense a condition of a connection between the interface body and a connected component functionally coupled to the interface body.

2. The coaxial interface of claim 1, further comprising:
a status output component, the status output component being positioned within the interface body and electrically coupled to the sensing circuit, the status output component being configured to communicate a status of the condition to a location external to the interface body.

3. The coaxial interface of claim 1, wherein the sensing circuit further comprises a sensor, wherein the sensor senses the condition.

4. The coaxial interface of claim 3, wherein the sensor is a mechanical connection tightness sensor for detecting mating forces of the coaxial interface with the connected component.

5. The coaxial interface of claim 3, wherein the sensor is an electrical proximity connection tightness sensor for detecting tightness of the connection of the coaxial interface with the connected component.

6. The coaxial interface of claim 3, wherein the sensor is an optical connection tightness sensor for detecting tightness of the connection of the coaxial interface with the connected component.

7. The coaxial interface of claim 3, wherein the sensor is a strain connection tightness sensor for detecting mating forces of the coaxial interface with the connected component.

8. The coaxial interface of claim 1, wherein the connected component comprises male or female coaxial cable connectors or male or female coaxial cable ports.

9. The coaxial interface of claim 1, wherein the coaxial interface facilitates daisy chaining of coaxial components.

10. A coaxial interface comprising:
   an interface body;
   a coupling circuit, the coupling circuit being positioned within the interface body and configured to sense an electrical signal flowing through the coaxial interface under a condition that the interface body is functionally coupled to a connected component;
   a sensing circuit positioned within the interface body and electrically coupled to the coupling circuit,
   wherein the sensing circuit is configured to sense a parameter of the electrical signal flowing through the coaxial interface.

11. The coaxial interface of claim 10, wherein the coupling circuit is configured to communicate the parameter of the electrical signal to a location external to the interface body.

12. The coaxial interface of claim 10, wherein the parameter comprises a signal level of the electrical signal, and the sensing circuit comprises a signal power level sensor that is configured to sense the parameter.

13. The coaxial interface of claim 10, wherein the coupling circuit comprises a coupling device, wherein the coupling device is an antenna.

14. The coaxial interface of claim 10, wherein the coupling circuit comprises a coupling device, wherein the coupling device is coupled to a center conductor of the coaxial interface.

15. The coaxial interface of claim 10, wherein the coupling circuit comprises a directional coupling device and a diplexer.

16. The coaxial interface of claim 10, wherein the connected component comprises male or female coaxial cable connectors or male or female coaxial cable ports.

17. The coaxial interface of claim 10, wherein the coaxial interface facilitates daisy chaining of coaxial components.

18. A coaxial interface, the coaxial interface comprising:
   an interface body;
   means for sensing a physical parameter status condition of a connection between the interface body and a connected component under a condition that the interface body is coupled to the connected component, the means for monitoring the physical parameter status condition being located within the interface body;
   means for sensing an electrical signal flowing through the coaxial interface, the means for sensing the electrical signal being positioned within the interface body; and
   means for sensing a parameter of the electrical signal flowing through the coaxial interface, the means for sensing the parameter of the electrical signal being located within the interface body.

19. The coaxial interface of claim 18, the interface further comprising means for communicating the physical parameter status condition and the parameter of the electrical signal to a location outside of the interface body.

20. The coaxial interface of claim 18, wherein the location outside of the interface body is a handheld reader in either physical or wireless communication with the coaxial interface, wherein the handheld reader conveys the sensed physical parameter status condition and the sensed parameter of the electrical signal.

21. The coaxial interface of claim 18, wherein the connected component comprises male or female coaxial cable connectors or male or female coaxial cable ports.

22. The coaxial interface of claim 18, wherein the coaxial interface facilitates daisy chaining of coaxial components.

23. A coaxial interface connection system, the system comprising:
   a connector;
   a coaxial interface comprising an interface body, a coupling circuit within the interface body, a status output component within the interface body, and a sensing circuit electrically coupled to the coupling circuit within the interface body,
   wherein the coupling circuit is configured to sense an electrical signal flowing through the coaxial interface, and
   wherein, in a state that the connector is coupled to the coaxial interface, the sensing circuit is configured to sense a parameter of the electrical signal flowing through the coaxial interface and to sense a condition of the connection between the coaxial interface and the connector,
   a communications device, the coaxial interface being coupled to the communications device, and the connector being coupled to the coaxial interface to establish an operative connection between the connector and the communications device; and
   a reading device located externally to the coaxial interface, wherein the reading device is configured to receive, via the coupling circuit or the status output component, a signal comprising a reading associated with the parameter of the electrical signal or the condition of the operative connection, respectively.

24. The coaxial interface connection system of claim 23, wherein the coaxial interface further comprises an input component.

25. The coaxial interface connection system of claim 24, wherein the reading device is configured to transmit a command signal to be received by the input component.

26. The coaxial interface connection system of claim 23, wherein the communications device receives signal outputs from the coaxial interface communicating the parameter or condition.

27. The coaxial interface connection system of claim 23, wherein the reading device communicates with the communications device to obtain the sensed parameter or condition.

28. The coaxial interface connection system of claim 23, wherein the coaxial interface connection system facilitates daisy chaining of coaxial components.

29. A coaxial adapter, the adapter comprising:
   an adapter body;
   a coupling circuit, the coupling circuit being positioned within the adapter body and configured to sense an electrical signal flowing through the coaxial adapter in a state that the coaxial adapter is functionally coupled to a connected component;
   a sensing circuit positioned within the adapter body and electrically coupled to the coupling circuit, wherein, under the condition that the adapter body is coupled to the connected component, the sensing circuit is configured to sense a parameter of the electrical signal flowing through the coaxial adapter and to sense a condition of the connection between the adapter body and the connected component.

30. The adapter of claim 29, further comprising:
a status output component, the status output component being positioned within the adapter body and electrically coupled to the sensing circuit, the status output component being configured to communicate the status of the condition to a location external to the adapter, and wherein the coupling circuit is configured to communicate the parameter to the location external to the adapter.

31. The adapter of claim 29, wherein the sensing circuit further comprises a sensor, wherein the sensor senses the condition.

32. The adapter of claim 31, wherein the sensor is a mechanical connection tightness sensor for detecting mating forces of the adapter body with the connected component.

33. The adapter of claim 31, wherein the sensor is an electrical proximity connection tightness sensor for detecting tightness of the connection of the adapter body with the connected component.

34. The adapter of claim 31, wherein the sensor is an optical connection tightness sensor for detecting tightness of the connection of the adapter body with the connected component.

35. The adapter of claim 31, wherein the sensor is a strain connection tightness sensor for detecting mating forces of the adapter body with the connected component.

36. The adapter of claim 29, wherein the parameter comprises a signal level of the electrical signal, and the sensing circuit comprises a signal power level sensor that is configured to sense the parameter.

37. The adapter of claim 29, wherein the coupling circuit comprises a coupling device, wherein the coupling device is an antenna.

38. The adapter of claim 29, wherein the coupling circuit comprises a coupling device, wherein the coupling device is coupled to a center conductor of the adapter body.

39. The adapter of claim 29, wherein the coupling circuit comprises a directional coupling device and a diplexer.

40. The adapter of claim 29, wherein the connected component comprises male or female coaxial cable connectors or male or female coaxial cable ports.

41. The adapter of claim 29, wherein the coaxial adapter is configured to be inserted between existing connected components, the existing connected components having been operatively coupled together prior to the insertion of the coaxial adapter there between.

42. The adapter of claim 41, wherein the existing connected parts comprise any combination of male ports and female connectors, female ports and male connectors, male and female connectors, or male and female ports coupled together.

43. A coaxial interface connection method comprising:
providing a coaxial interface comprising an interface body, a coupling circuit positioned within the interface body, a sensing circuit electrically connected to the coupling circuit, and an output component positioned within the interface body, wherein the sensing circuit is positioned within the interface body, wherein the coupling circuit is configured to sense an electrical signal flowing through the coaxial interface in a state that the interface body is connected to a connected component, wherein the sensing circuit is configured to sense a parameter of the electrical signal flowing through the coaxial interface and a condition of the connection between the interface body and the connected component, and wherein the output component is in communication with the sensing circuit to receive a reading associated with the parameter or the condition;
connecting the interface body to the connected component to form an operative connection; and
reporting the reading associated with the parameter or the condition, via the output component, to communicate the reading to a location external to the coaxial interface.

44. The method of claim 43, wherein the parameter of the electrical signal and the condition of the connection is communicated wirelessly to the location external to the coaxial interface.

45. The method of claim 43, wherein the parameter comprises a signal level of the electrical signal.

46. The method of claim 43, wherein the condition comprises a mating force between the interface body and the connected component.

47. The method of claim 43, wherein the condition comprises a tightness between the interface body and the connected component.

48. The method of claim 43, wherein the coupling circuit comprises a coupling device.

49. The method of claim 48, wherein the coupling device is an antenna.

50. The method of claim 48, wherein the coupling device is coupled to a center conductor of the coaxial interface.

51. The method of claim 43, wherein the coaxial interface further comprises an input component.

52. The method of claim 51, further comprising transmitting an input signal from a reader external to the input component to command the coaxial interface to report the parameter or the condition.

53. A coaxial adapter connection method, the method comprising:
providing an adapter comprising an adapter body, a coupling circuit positioned within the adapter body, a sensing circuit electrically connected to the coupling circuit, and an output component positioned within the adapter body, wherein the sensing circuit is positioned within the adapter body, wherein the coupling circuit is configured to sense an electrical signal flowing through the coaxial adapter in a state that the adapter body is connected between components, wherein the sensing circuit is configured to sense a parameter of the electrical signal flowing through the coaxial adapter and a condition of the connection between the adapter body and the components, and wherein the output component is in communication with the sensing circuit to receive a reading associated with the parameter or the condition;
disconnecting the components from one another;
connecting each of the components to opposing ends of the coaxial adapter, such that the coaxial adapter is operatively coupled between the components to form an operative connection; and
reporting the reading associated with the parameter or the condition, via the output component, to communicate the reading to a location external to the adapter.

54. The method of claim 53, wherein the parameter of the electrical signal and the condition of the connection is communicated wirelessly to the location external to the coaxial adapter.

55. The method of claim 53, wherein the parameter comprises a signal level of the electrical signal.

56. The method of claim 53, wherein the condition comprises a mating force between the adapter body and at least one of the components.

57. The method of claim 53, wherein the condition comprises a tightness between the adapter body and at least one of the components.

58. The method of claim 53, wherein the coupling circuit comprises a coupling device.

59. The method of claim 58, wherein the coupling device is an antenna.

60. The method of claim 58, wherein the coupling device is coupled to a center conductor of the coaxial adapter.

61. The method of claim 53, wherein the coaxial adapter further comprises an input component.

62. The method of claim 61, further comprising transmitting an input signal from a reader external to the input component to command the coaxial adapter to report the parameter or the condition.

* * * * *